(12) United States Patent
Ishino

(10) Patent No.: US 11,152,911 B2
(45) Date of Patent: Oct. 19, 2021

(54) PIEZOELECTRIC RESONATOR DEVICE

(71) Applicant: Daishinku Corporation, Kakogawa (JP)

(72) Inventor: Satoru Ishino, Kakogawa (JP)

(73) Assignee: Daishinku Corporation, Kakogawa (JP)

( * ) Notice: Subject to any disclaimer, the term of this patent is extended or adjusted under 35 U.S.C. 154(b) by 434 days.

(21) Appl. No.: 16/308,826

(22) PCT Filed: Aug. 31, 2017

(86) PCT No.: PCT/JP2017/031364
§ 371 (c)(1),
(2) Date: Dec. 11, 2018

(87) PCT Pub. No.: WO2018/051800
PCT Pub. Date: Mar. 22, 2018

(65) Prior Publication Data
US 2019/0312562 A1    Oct. 10, 2019

(30) Foreign Application Priority Data

Sep. 16, 2016 (JP) .............................. JP2016-181255
Sep. 16, 2016 (JP) .............................. JP2016-181256

(51) Int. Cl.
*H03H 9/02* (2006.01)
*H03H 9/05* (2006.01)
(Continued)

(52) U.S. Cl.
CPC .......... *H03H 9/02133* (2013.01); *H03H 9/02* (2013.01); *H03H 9/02102* (2013.01);
(Continued)

(58) Field of Classification Search
CPC ............. H03H 9/02133; H03H 9/0547; H03H 9/02102; H03H 9/0523; H03H 9/0552; H03H 9/1035; H03H 9/19; H03B 5/36
See application file for complete search history.

(56) References Cited

U.S. PATENT DOCUMENTS 6,215,229 B1 *  4/2001  Kuroda .................... H03H 3/04
                                                                310/320
6,373,169 B1 *  4/2002  Wajima ................ H03H 9/0514
                                                                310/320
(Continued)

FOREIGN PATENT DOCUMENTS

JP    2001-177369 A    6/2001
JP    2006-067256 A    3/2006
(Continued)

*Primary Examiner* — Jeffrey M Shin
(74) *Attorney, Agent, or Firm* — Metrolex IP Law Group, PLLC

(57) ABSTRACT

A crystal resonator (101) includes: a piezoelectric resonator plate (2) on which a first excitation electrode and a second excitation electrode are formed; a first sealing member (3) that covers the first excitation electrode of the piezoelectric resonator plate (2); and a second sealing member (4) that covers the second excitation electrode of the piezoelectric resonator plate (2). The first sealing member (3) is bonded to the piezoelectric resonator plate (2) while the second sealing member (4) is bonded to the piezoelectric resonator plate (2) so that an internal space (13), which hermetically seals a vibrating part including the first excitation electrode and the second excitation electrode of the piezoelectric resonator plate (2), is formed. Plating films (51, 52) are formed respectively on both the first sealing member (3) and the second sealing member (4), on respective surfaces opposite to surfaces to be bonded to the piezoelectric resonator plate (2).

9 Claims, 22 Drawing Sheets

(51) Int. Cl.
 *H03H 9/10* (2006.01)
 *H03H 9/19* (2006.01)
 *H03B 5/36* (2006.01)

(52) U.S. Cl.
 CPC ........ *H03H 9/0523* (2013.01); *H03H 9/0547* (2013.01); *H03H 9/0552* (2013.01); *H03H 9/1035* (2013.01); *H03H 9/19* (2013.01); *H03B 5/36* (2013.01)

(56) References Cited

U.S. PATENT DOCUMENTS

| | | |
|---|---|---|
| 2001/0030490 A1 | 10/2001 | Wajima et al. |
| 2011/0215678 A1* | 9/2011 | Kohda .................... H01L 41/29 310/344 |
| 2012/0306321 A1 | 12/2012 | Ishii |
| 2014/0361665 A1 | 12/2014 | Hayasaka et al. |
| 2015/0171821 A1 | 6/2015 | Ishii |
| 2018/0034442 A1 | 2/2018 | Kojo et al. |

FOREIGN PATENT DOCUMENTS

| | | |
|---|---|---|
| JP | 2007-031826 A | 2/2007 |
| JP | 2007-235707 A | 9/2007 |
| JP | 2009-201067 A | 9/2009 |
| JP | 2010-252051 A | 11/2010 |
| JP | 2010-252321 A | 11/2010 |
| JP | 2013-168893 A | 8/2013 |
| JP | 2014-239358 A | 12/2014 |
| TW | 201251157 A | 12/2012 |
| WO | WO2016/136283 A1 | 9/2016 |

* cited by examiner

PIEZOELECTRIC RESONATOR DEVICE

TECHNICAL FIELD

The present invention relates to a piezoelectric resonator device.

BACKGROUND ART

Recent years, in various electronic devices, their operating frequencies have increased and their packages (especially, their height) have been downsized. According to such an increase in operating frequency and a reduction in package size, there is also a need for piezoelectric resonator devices (such as a crystal resonator and a crystal oscillator) to be adaptable to the increase in operating frequency and the reduction in package size.

In this kind of piezoelectric resonator devices, a housing is constituted of a package having a substantially rectangular parallelepiped shape. The package is constituted of: a first sealing member and a second sealing member both made of, for example, glass or crystal; and a piezoelectric resonator plate made of, for example, crystal. On respective main surfaces of the piezoelectric resonator plate, excitation electrodes are formed. The first sealing member and the second sealing member are laminated and bonded via the piezoelectric resonator plate. Thus, a vibrating part (excitation electrodes) of the piezoelectric resonator plate that is disposed in the package (in the internal space) is hermetically sealed (for example, see Patent Document 1). Hereinafter, such a laminated structure of the piezoelectric resonator device is referred to as a sandwich structure.

Examples of a method for mounting the piezoelectric resonator device include wire bonding and solder mounting. In order to suitably applied to the solder mounting, external electrode terminals made by plating a sputtered film have been considered (see Patent Documents 2 and 3).

PRIOR ART DOCUMENTS

Patent Documents

[Patent Document 1] JP 2010-252051 A
[Patent Document 2] JP 2014-239358 A
[Patent Document 2] JP 2007-031826 A

SUMMARY OF THE INVENTION

Problem to be Solved by the Invention

When a piezoelectric resonator device having the sandwich structure is mounted on an electric circuit board, the mounting method to be used is appropriately selected by a user. In the result, the solder mounting may naturally be used.

On the other hand, the piezoelectric resonator device having the sandwich structure is a device adaptable to reduction in package size (especially in package height). Accordingly, it is remarkably thinned compared to conventional piezoelectric resonator devices having general structures.

When a plating film is formed on the thinned piezoelectric resonator device having the sandwich structure, a problem of warpage emerges due to internal stress generated in the plating film. Specifically, the plating films for solder mounting are formed on the external electrode terminals of the piezoelectric resonator device, and since the external electrode terminals are formed only on one surface of the piezoelectric resonator device, the internal stress generated in the plating films causes warpage of the piezoelectric resonator device. The piezoelectric resonator device having the conventional thick structure has no particular problem caused by such warpage. However, the thinned piezoelectric resonator device having the sandwich structure has only a small resistance to the warpage. Thus, the warpage caused by the plating films cannot be ignored.

Also, the above warpage is not derived only from formation of the plating films for solder mounting. That is, in order to perform excellent soldering, a laminated film other than the plating film is sometimes formed on each of the external electrode terminals of the piezoelectric resonator device to be mounted by soldering. Since the internal stress is also generated in the laminated films, the above warpage more or less occurs.

The present invention was made in consideration of the above problem, an object of which is to provide a piezoelectric resonator device having a sandwich structure, which can be prevented from warping due to plating films and the like.

Means for Solving the Problem

In order to solve the above problem, a piezoelectric resonator device of the present invention includes: a piezoelectric resonator plate including a first excitation electrode that is formed on a first main surface of a substrate, and a second excitation electrode that is formed on a second main surface of the substrate and that makes a pair with the first excitation electrode; a first sealing member that covers the first excitation electrode of the piezoelectric resonator plate; a second sealing member that covers the second excitation electrode of the piezoelectric resonator plate; and an internal space that is formed by bonding the first sealing member to the piezoelectric resonator plate and by bonding the second sealing member to the piezoelectric resonator plate so as to hermetically seal a vibrating part including the first excitation electrode and the second excitation electrode of the piezoelectric resonator plate. Metal laminated films having the same film configuration and the same film thickness are formed on respective surfaces of the first sealing member and the second sealing member, the respective surfaces opposite to surfaces to be bonded to the piezoelectric resonator plate.

The piezoelectric resonator device having the sandwich structure is thinned compared to devices having the conventional structure. Thus, when the metal laminated films (for example, the metal laminated films constituted of a base film and a plating film formed on the base film) for solder mounting are formed only on one surface (i.e. the surface for solder mounting), a problem of warpage emerges due to stress caused by the metal laminated films. In the piezoelectric resonator device having the above configuration, the metal laminated films each having the same film configuration and the same film thickness are respectively formed on both the first sealing member and the second sealing member. Thus, the stress caused by the metal laminated films is offset, which results in reduction in warpage of the piezoelectric resonator device.

In the above-described piezoelectric resonator device, it is preferable that the first excitation electrode and the second excitation electrode are connected to the metal laminated films via through holes and no castellation is used to establish conduction between electrodes.

The piezoelectric resonator device having the structure including the castellation leads to increased width and depth of the device because of increase in the film thickness of the castellation due to the metal laminated films such as plating. In the above-described configuration, the through holes are used to establish conduction between the electrodes so that the castellation is not provided, which can avoid increase in width and depth of the device.

In the above-described piezoelectric resonator device, the metal laminated films may each have a four-layer structure constituted of a base layer, a barrier layer, a soldering layer and a protective layer, and the above layers other than the protective layer may contain titanium (Ti).

With the above-described configuration, when the layers are formed using the film forming step by sputtering and the patterning step by etching, the three layers containing Ti other than the protective layer can be collectively subjected to the patterning step by etching, which simplifies the producing processes. Also, in the above-described piezoelectric resonator device, the metal laminated film can include an electroless plating film as a part thereof.

The electroless plating layer has a relatively large layer thickness and the warpage problem becomes remarkable. Thus, with the above configuration, the present invention can be suitably applied.

Also, in the above-described piezoelectric resonator device, a sealing part to hermetically seal the vibrating part of the piezoelectric resonator plate may be formed between the first sealing member and the piezoelectric resonator plate, and between the piezoelectric resonator plate and the second sealing member, so that the sealing part has an annular shape that surrounds the vibrating part in plan view. The sealing part and a base pattern on which the electroless plating film is formed may each be constituted of a Ti—Au layer.

In the piezoelectric resonator device having the sandwich structure, the first sealing member, the piezoelectric resonator plate and the second sealing member are bonded to one another, thus the vibrating part of the piezoelectric resonator plate is hermetically sealed. In this case, since the sealing parts each made of a Ti—Au layer are formed, it is possible to perform the diffusion bonding by overlapping connection metal patterns (Ti—Au layer) respectively formed on the first sealing member, on the piezoelectric resonator plate and on the second sealing member with one another, thus, they can be bonded without using any adhesive or the like separately. Also, by forming the respective base patterns of the electroless plating films as the Ti—Au layers also used for the sealing parts, it is possible to simplify the processes.

Also in the above-described piezoelectric resonator device, an IC chip may be mounted on the first sealing member, and the metal laminated film formed on the first sealing member may include a mounting terminal and wiring to mount the IC chip. The metal laminated film formed on the second sealing member may include an external electrode terminal to mount the piezoelectric resonator device on a circuit board.

With the above-described configuration, the present invention can be applied to a crystal oscillator on which an IC chip is mounted.

Effects of the Invention

In the piezoelectric resonator device of the present invention, the metal laminated films each having the same film configuration and the same film thickness are respectively formed on both the first sealing member and the second sealing member of the device having the sandwich structure. Thus, the stress caused by the metal laminated films is offset, which provides an effect that warpage of the piezoelectric resonator device is reduced.

MEANS FOR CARRYING OUT THE INVENTION

First Embodiment

Hereinafter, an embodiment of the present invention will be described with reference to the drawings.

Figure 1:
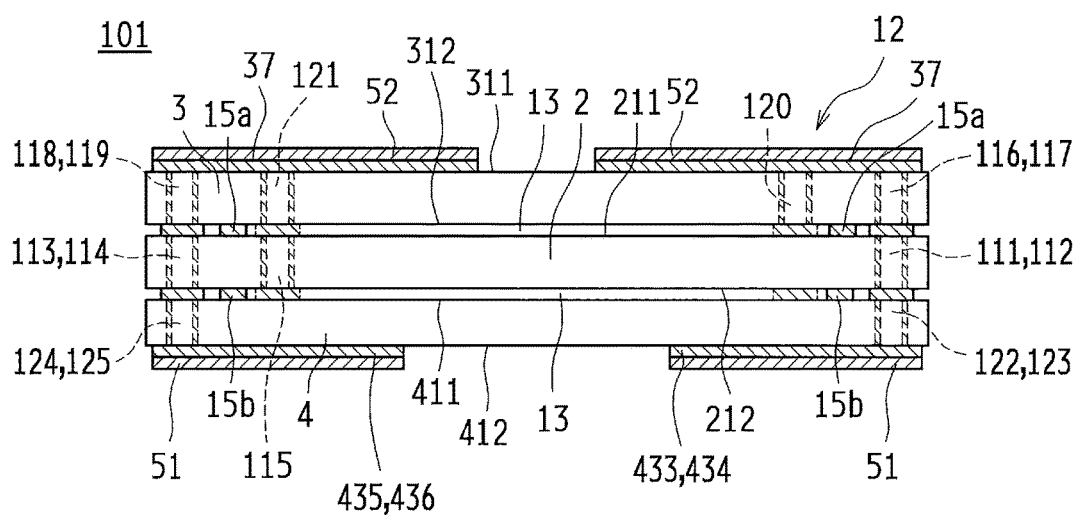
FIG. 1 is a schematic configuration diagram schematically illustrating a configuration of a crystal resonator according to the first embodiment.
Figure 2:
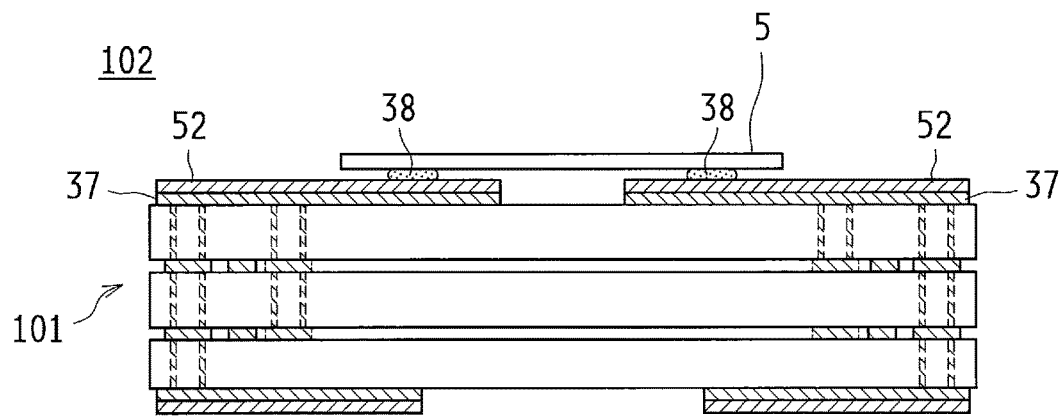
FIG. 2 is a schematic configuration diagram schematically illustrating a configuration of a crystal oscillator according to the first embodiment.

FIG. 1 is a schematic configuration diagram schematically illustrating a configuration of a crystal resonator 101. FIG. 2 is a schematic configuration diagram schematically illustrating a configuration of a crystal oscillator 102. The crystal oscillator 102 shown in FIG. 2 is constituted of the crystal resonator 101 shown in FIG. 1 and an IC chip 5 mounted on an upper surface of the crystal resonator 101. The IC chip 5 as the electronic component element is a one-chip integrated circuit element constituting, with the crystal resonator 101, an oscillation circuit. The piezoelectric resonator device of the present invention means both a crystal resonator and a crystal oscillator. Here, the configuration of the crystal resonator 101 according to this embodiment is described.

—Crystal Resonator—

As shown in FIG. 1, the crystal resonator 101 according to this embodiment includes a crystal resonator plate (piezoelectric resonator plate) 2, a first sealing member 3 and a second sealing member 4. In the crystal resonator 101, the crystal resonator plate 2 is bonded to the first sealing member 3, and also the crystal resonator plate 2 is bonded to the second sealing member 4. Thus, a package 12 having a sandwich structure is constituted. The first sealing member 3 is bonded to the crystal resonator plate 2 so as to cover a first excitation electrode 221 (see FIG. 5) formed on a first main surface 211 of the crystal resonator plate 2. The second sealing member 4 is bonded to the crystal resonator plate 2 so as to cover a second excitation electrode 222 (see FIG. 6) formed on a second main surface 212 of the crystal resonator plate 2.

In the crystal resonator 101, the first sealing member 3 and the second sealing member 4 are bonded respectively to the main surfaces (first main surface 211 and second main surface 212) of the crystal resonator plate 2, thus an internal space 13 of the package 12 is formed. In this internal space 13, a vibrating part 22 (see FIGS. 5 and 6) including the first excitation electrode 221 and the second excitation electrode 222 is hermetically sealed. The crystal resonator 101 according to this embodiment has, for example, a package size of 1.0×0.8 mm, which is reduced in size and height.

Next, the specific configuration of the above-described crystal resonator 101 is described referring to FIGS. 1 and 3 to 8. Here, each of the crystal resonator plate 2, the first sealing member 3 and the second sealing member 4 will be described as a single member.

Figure 5:
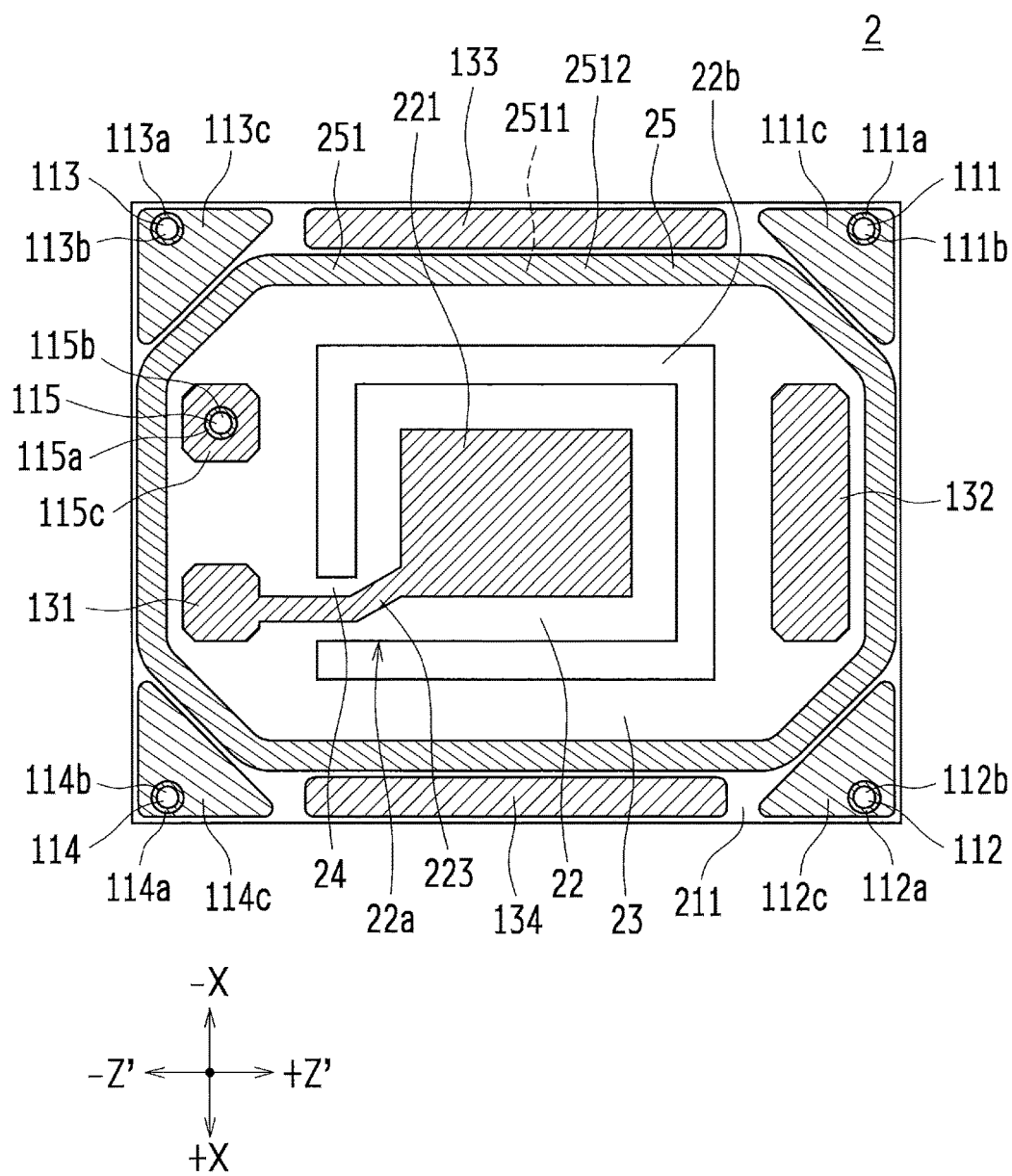
FIG. 5 is a schematic plan view illustrating a crystal resonator plate of the crystal resonator according to the first embodiment.
Figure 6:
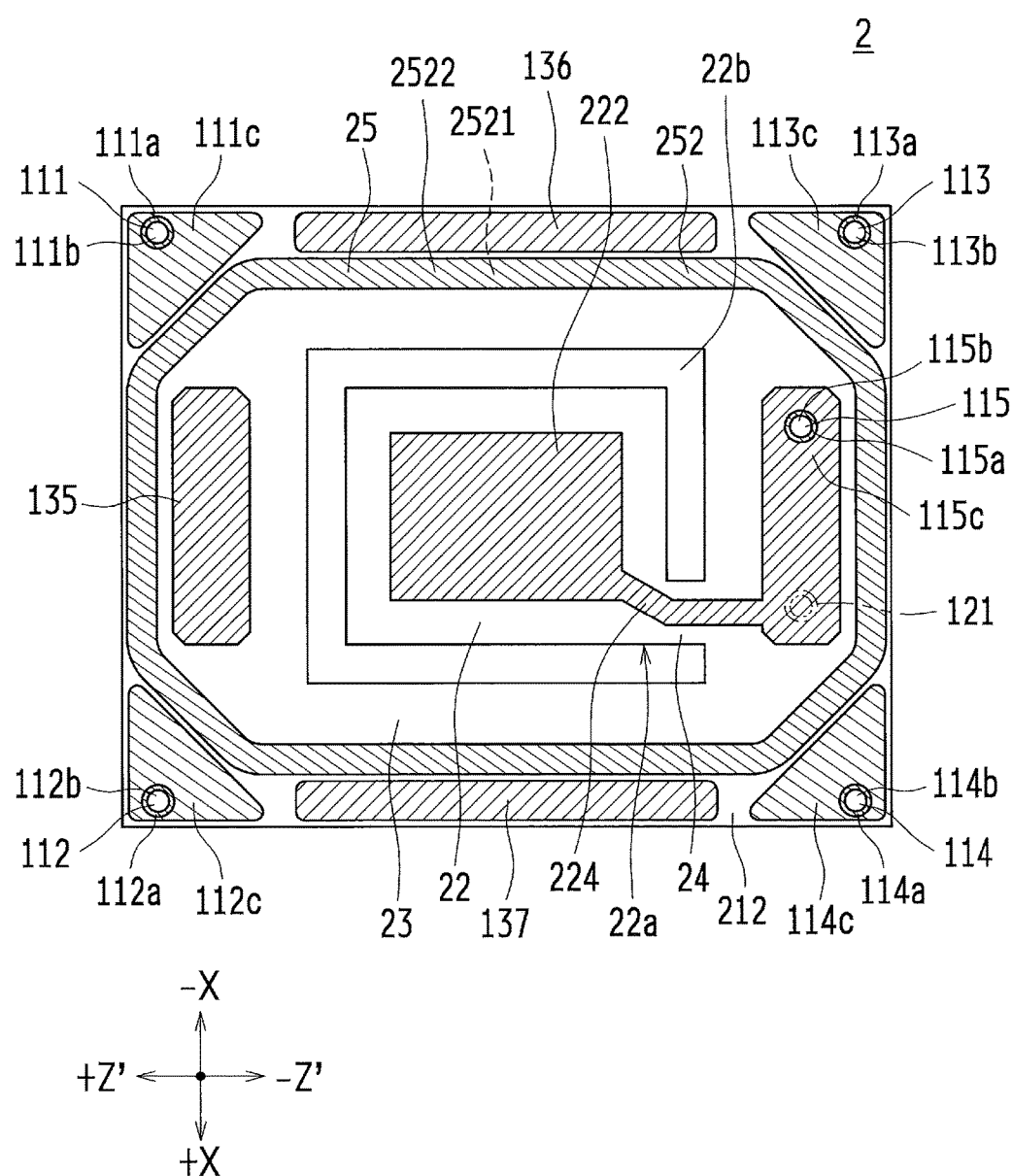
FIG. 6 is a schematic rear view illustrating the crystal resonator plate of the crystal resonator according to the first embodiment.

The crystal resonator plate 2 is a piezoelectric substrate made of crystal. As shown in FIGS. 5 and 6, both main surfaces 211 and 212 are formed as smooth flat surfaces (mirror-finished). In this embodiment, an AT-cut crystal plate that causes thickness shear vibration is used as the crystal resonator plate 2. In the crystal resonator plate 2 shown in FIGS. 5 and 6, each main surface 211 and 212 of the crystal resonator plate 2 is an XZ' plane. On this XZ' plane, the lateral direction (short side direction) of the crystal resonator plate 2 is the X axis direction, and the longitudinal direction (long side direction) of the crystal resonator plate 2 is the Z' axis direction. The AT-cut method is a processing method in which a crystal plate is cut out of synthetic quartz crystal at an angle tilted by 35° 15' about the X axis from the Z axis, out of the three crystal axes (i.e. an electrical axis (X axis), a mechanical axis (Y axis) and an optical axis (Z axis)) of the synthetic quartz crystal. The X axis of the AT-cut crystal plate equals the crystal axis of the crystal. The Y' axis and the Z' axis equal the respective axes that tilt by 35° 15' from the Y axis and the Z axis out of the crystal axes of the crystal. The Y' axis direction and the Z' axis direction correspond to the directions in which the AT-cut crystal is cut out.

A pair of excitation electrodes (i.e. the first excitation electrode 221 and the second excitation electrode 222) is formed, respectively, on the main surfaces 211 and 212 of the crystal resonator plate 2. The crystal resonator plate 2 includes: the vibrating part 22 formed so as to have a substantially rectangular shape; an external frame part 23 surrounding the outer periphery of the vibrating part 22; and a connecting part 24 that connects the vibrating part 22 to the external frame part 23. The vibrating part 22, the connecting part 24 and the external frame part 23 are integrally formed. In this embodiment, the connecting part 24 is provided at only one position between the vibrating part 22 and the external frame part 23, and the remaining part between the vibrating part 22 and the external frame part 23 on which the connecting part 24 is not provided is made as a space (clearance) 22b. Although it is not shown in the drawings, the vibrating part 22 and the connecting part 24 are formed so as to have the thickness thinner than the external frame part 23. Due to the difference in the thickness between the external frame part 23 and the connecting part 24, the natural frequency of piezoelectric vibration differs between the external frame part 23 and the connecting part 24. Thus, the external frame part 23 is not likely to resonate with the piezoelectric vibration of the connecting part 24.

The connecting part 24 extends (protrudes) from only one corner part 22a positioned in the +X direction and in the −Z' direction of the vibrating part 22 to the external frame part 23 in the −Z' direction. Thus, since the connecting part 24 is disposed on the corner part 22a where displacement of the piezoelectric vibration is relatively small in an outer peripheral edge part of the vibrating part 22, it is possible to prevent leakage of the piezoelectric vibration to the external frame part 23 via the connecting part 24 compared to the case in which the connecting part 24 is provided on the position other than the corner part 22a (i.e. central part of the respective sides), which makes the vibrating part 22 piezoelectrically vibrate more effectively.

The first excitation electrode 221 is provided on the first main surface of the vibrating part 22 while the second excitation electrode 222 is provided on the second main surface of the vibrating part 22. Extraction electrodes (a first extraction electrode 223 and a second extraction electrode 224) are respectively connected to the first excitation electrode 221 and the second excitation electrode 222. The first extraction electrode 223 is drawn from the first excitation electrode 221 and connected to a connection bonding pattern 131 formed on the external frame part 23 via the connecting part 24. The second extraction electrode 224 is drawn from the second excitation electrode 222 and connected to a connection bonding pattern 115c formed on the external frame part 23 via the connecting part 24. The first excitation electrode 221 and the first extraction electrode 223 are constituted of a base PVD film deposited on the first main surface 211 by physical vapor deposition, and an electrode PVD film deposited on the base PVD film by the physical vapor deposition. The second excitation electrode 222 and the second extraction electrode 224 are constituted of a base PVD film deposited on the second main surface 212 by the physical vapor deposition, and an electrode PVD film deposited on the base PVD film by the physical vapor deposition.

Resonator-plate-side sealing parts 25 to bond the crystal resonator plate 2 respectively to the first sealing member 3 and the second sealing member 4 are provided on the respective main surfaces 211 and 212 of the crystal resonator plate 2. The resonator-plate-side sealing parts 25 include: a resonator-plate-side first bonding pattern 251 formed on the first main surface 211 of the crystal resonator plate 2; and a resonator-plate-side second bonding pattern 252 formed on the second main surface 212 of the crystal resonator plate 2. The resonator-plate-side first bonding pattern 251 and the resonator-plate-side second bonding pattern 252 are each formed on the external frame part 23 so as to have an annular shape in plan view. The first excitation electrode 221 and the second excitation electrode 222 are not electrically connected to the resonator-plate-side first bonding pattern 251 and the resonator-plate-side second bonding pattern 252.

The resonator-plate-side first bonding pattern 251 is constituted of a base PVD film 2511 deposited on the first main surface 211 by the physical vapor deposition, and an electrode PVD film 2512 deposited on the base PVD film 2511 by the physical vapor deposition. The resonator-plate-side second bonding pattern 252 is constituted of a base PVD film 2521 deposited on the second main surface 212 by the physical vapor deposition, and an electrode PVD film 2522 deposited on the base PVD film 2521 by the physical vapor deposition. That is, the resonator-plate-side first bonding pattern 251 and the resonator-plate-side second bonding pattern 252 have the same configuration in which a plurality of layers is laminated on each main surface 211 and 212, specifically, a Ti (titanium) layer and an Au (gold) layer are deposited by the vapor deposition in this order from the lowermost layer side. Thus, in the resonator-plate-side first bonding pattern 251 and the resonator-plate-side second bonding pattern 252, the base PVD films 2511 and 2521 are made of a single material (Ti), the electrode PVD films 2512 and 2522 are made of a single material (Au), and the electrode PVD films 2512 and 2522 have a thickness greater than the thickness of the base PVD films 2511 and 2521. The first excitation electrode 221 and the resonator-plate-side first bonding pattern 251 both formed on the first main surface 211 of the crystal resonator plate 2 have the same thickness, and the surfaces of the first excitation electrode 221 and the resonator-plate-side first bonding pattern 251 are made of the same metal. Similarly to the above, the second excitation electrode 222 and the resonator-plate-side second bonding pattern 252 both formed on the second main surface 212 of the crystal resonator plate 2 have the same thickness, and the surfaces of the second excitation electrode 222 and the resonator-plate-side second bonding pattern 252 are made of the same metal. The resonator-plate-side first bonding pattern 251 and the resonator-plate-side second bonding pattern 252 do not contain Sn.

Here, the first excitation electrode 221, the first extraction electrode 223 and the resonator-plate-side first bonding pattern 251 can have the same configuration so that they are collectively formed in the same process. Similarly to the above, the second excitation electrode 222, the second extraction electrode 224 and the resonator-plate-side second bonding pattern 252 can have the same configuration so that they are collectively formed in the same process. More specifically, the base PVD films and the electrode PVD films are formed using a PVD method (for example, a film forming method for patterning in processing such as photolithography) such as vacuum deposition, sputtering, ion plating, molecular beam epitaxy (MBE) and laser ablation. Thus, it is possible to form the films collectively, which leads to reduction in producing processes and in cost.

Also, as shown in FIGS. 5 and 6, five through holes (first to fifth through holes 111 to 115) are formed in the crystal resonator plate 2 so as to penetrate between the first main surface 211 and the second main surface 212. The first to fourth through holes 111 to 114 are respectively disposed in the external frame part 23, at the four corners (corner parts) of the crystal resonator plate 2. The fifth through hole 115 is disposed in the external frame part 23 of the crystal resonator plate 2, on one side in the Z' axis direction relative to the vibrating part 22 of the crystal resonator plate 2 (in FIGS. 5 and 6, on the side in the −Z' direction).

The first through hole 111 is connected to a sixth through hole 116 of the first sealing member 3 and to a twelfth through hole 122 of the second sealing member 4. The second through hole 112 is connected to a seventh through hole 117 of the first sealing member 3 and to a thirteenth through hole 123 of the second sealing member 4. The third through hole 113 is connected to an eighth through hole 118 of the first sealing member 3 and to a fourteenth through hole 124 of the second sealing member 4. The fourth through hole 114 is connected to a ninth through hole 119 of the first sealing member 3 and to a fifteenth through hole 125 of the second sealing member 4. The fifth through hole 115 is connected to the second extraction electrode 224 drawn from the second excitation electrode 222 and to a tenth through hole 120 of the first sealing member 3 via a wiring pattern 33.

In the first to fifth through holes 111 to 115, through electrodes 111a to 115a are respectively formed along a corresponding inner wall surface of the first to fifth through holes 111 to 115 so as to establish conduction between the electrodes formed on the first main surface 211 and the second main surface 212. Respective central parts of the first to fifth through holes 111 to 115 are hollow through parts 111b to 115b penetrating between the first main surface 211 and the second main surface 212. Connection bonding patterns 111c to 115c are formed on respective outer peripheries of the first to fifth through holes 111 to 115. The connection bonding patterns 111c to 115c are formed respectively on the main surfaces 211 and 212 of the crystal resonator plate 2.

The connection bonding patterns 111c to 115c have the same configuration as the resonator-plate-side first bonding pattern 251 and the resonator-plate-side second bonding pattern 252, accordingly, they can be formed by the same process as that for the resonator-plate-side first bonding pattern 251 and the resonator-plate-side second bonding pattern 252. Specifically, each of the connection bonding patterns 111c to 115c is constituted of a base PVD film deposited on each main surface (the first main surface 211 and the second main surface 212) of the crystal resonator plate 2 by the physical vapor deposition, and an electrode PVD film deposited on the base PVD film by the physical vapor deposition.

The connection bonding patterns 111c to 114c formed on both first main surface 211 and second main surface 212 of the crystal resonator plate 2 are respectively provided at the four corners (corner parts) of the crystal resonator plate 2 so that they are provided at a predetermined interval from the resonator-plate-side first bonding pattern 251 and the resonator-plate-side second bonding pattern 252. The connection bonding pattern 115c formed on the second main surface 212 of the crystal resonator plate 2 extends on the external frame part 23 of the crystal resonator plate 2 in the X axis direction, and it is integrally formed with the second extraction electrode 224 drawn from the second excitation electrode 222.

On the first main surface 211 of the crystal resonator plate 2, the connection bonding pattern 131 is disposed, which is integrally formed with the first extraction electrode 223 drawn from the first excitation electrode 221. The connection bonding pattern 131 is disposed on the external frame part 23 of the crystal resonator plate 2, on the side in the −Z' direction relative to the vibrating part 22 of the crystal resonator plate 2. Also on the first main surface 211 of the crystal resonator plate 2, a connection bonding pattern 132 is disposed on the side opposite to the connection bonding pattern 131 in the Z' axis direction with the vibrating part 22 of the crystal resonator plate 2 being interposed therebetween. That is, the connection bonding patterns 131 and 132 are provided respectively on both sides in the Z' axis direction relative to the vibrating part 22. The connection bonding pattern 132 extends on the external frame part 23 of the crystal resonator plate 2 in the X axis direction.

Also on the first main surface 211 of the crystal resonator plate 2, connection bonding patterns 133 and 134 are disposed on the external frame part 23 of the crystal resonator plate 2, on both sides in the X axis direction relative to the vibrating part 22. The connection bonding patterns 133 and 134 are provided on regions close to the respective long sides (regions along the respective long sides) of the crystal resonator plate 2, and extend in the Z' axis direction. The connection bonding pattern 133 is disposed between the connection bonding pattern 111c and the connection bonding pattern 113c formed on the first main surface 211 of the crystal resonator plate 2. The connection bonding pattern 134 is disposed between the connection bonding pattern 112c and the connection bonding pattern 114c.

On the second main surface 212 of the crystal resonator plate 2, a connection bonding pattern 135 is disposed on the side opposite to the connection bonding pattern 115c in the Z' axis direction with the vibrating part 22 of the crystal resonator plate 2 being interposed therebetween. That is, the connection bonding patterns 115c and 135 are provided respectively on both sides in the Z' axis direction relative to the vibrating part 22. Also on the second main surface 212 of the crystal resonator plate 2, connection bonding patterns 136 and 137 are disposed on the external frame part 23 of the crystal resonator plate 2, on both sides in the X axis direction relative to the vibrating part 22. The connection bonding patterns 136 and 137 are provided on regions close to the respective long sides (regions along the respective long sides) of the crystal resonator plate 2, and extend in the Z' axis direction. The connection bonding pattern 136 is disposed between the connection bonding pattern 111c and the connection bonding pattern 113c formed on the second main surface 212 of the crystal resonator plate 2. The connection bonding pattern 137 is disposed between the connection bonding pattern 112c and the connection bonding pattern 114c.

In the crystal resonator 101, the first to fourth through holes 111 to 114 and the connection bonding patterns 111c to 114c, 133, 134, 136 and 137 are disposed outside the outer peripheries of the resonator-plate-side first bonding pattern 251 and the resonator-plate-side second bonding pattern 252. The fifth through hole 115 and the connection bonding patterns 115c, 131, 132 and 135 are disposed inside the inner peripheries of the resonator-plate-side first bonding pattern 251 and the resonator-plate-side second bonding pattern 252. The connection bonding patterns 111c to 115c and 131 to 137 are not electrically connected to the resonator-plate-side first bonding pattern 251 and the resonator-plate-side second bonding pattern 252.

Figure 3:
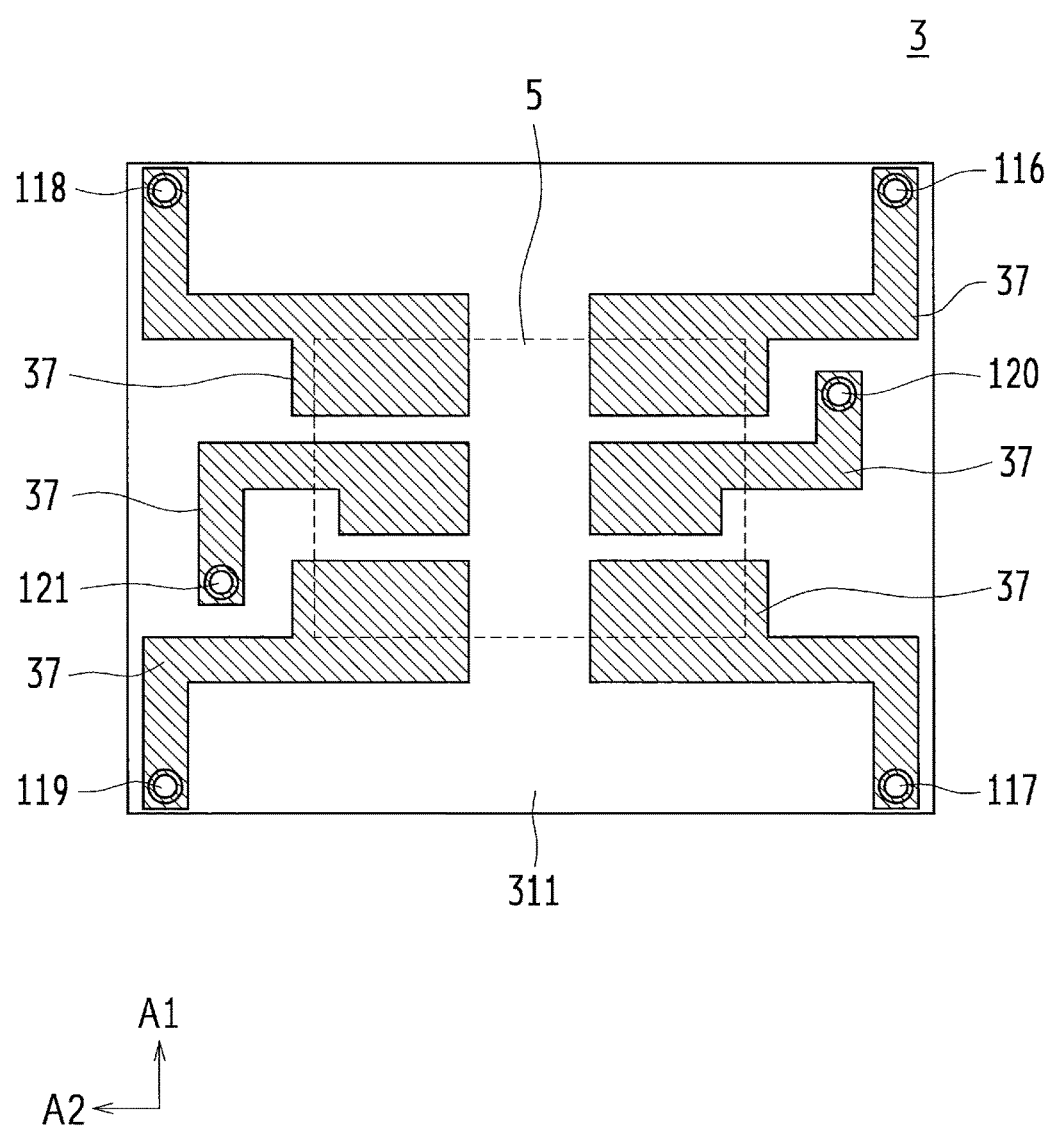
FIG. 3 is a schematic plan view illustrating a first sealing member of the crystal resonator according to the first embodiment.
Figure 4:
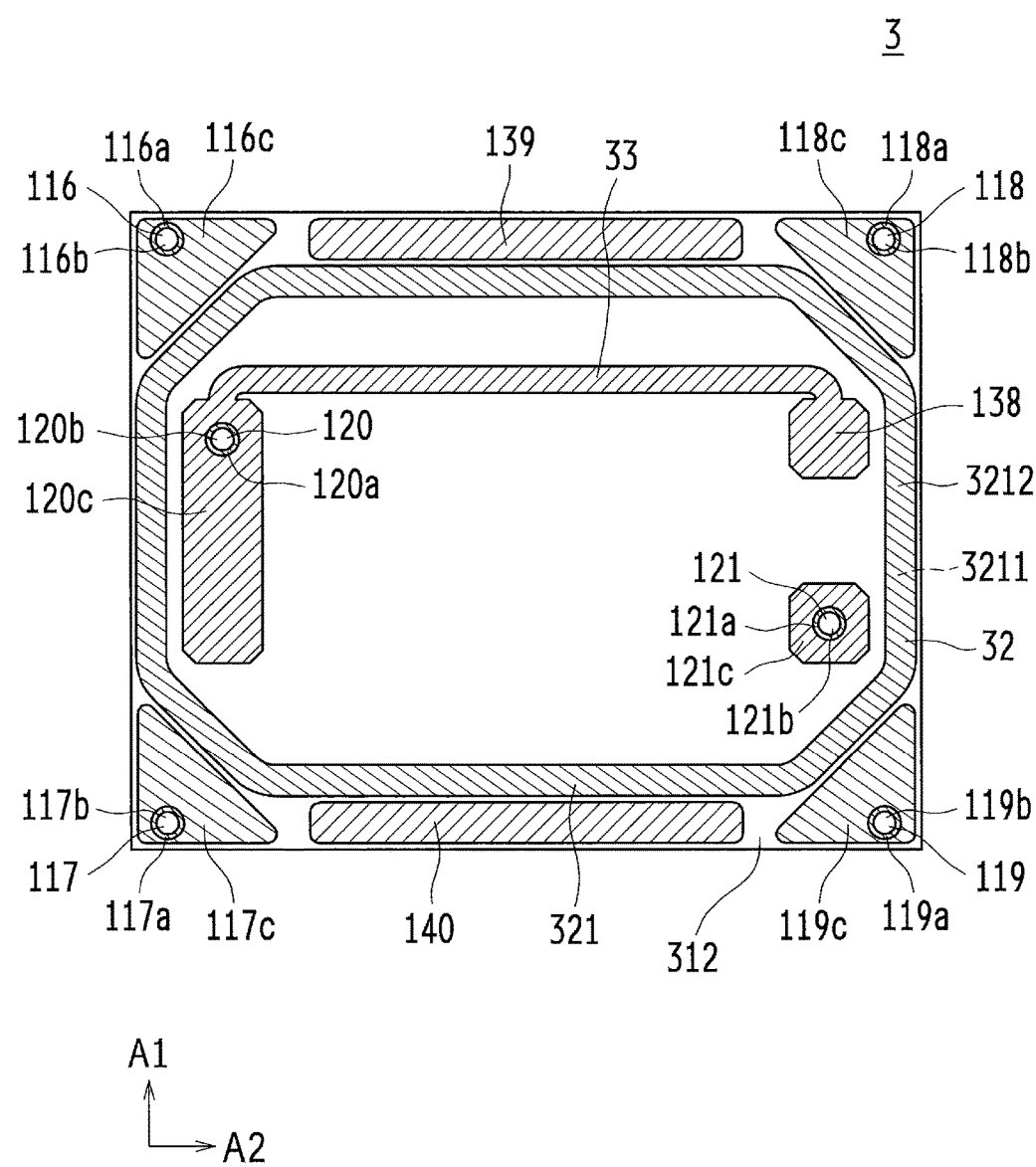
FIG. 4 is a schematic rear view illustrating the first sealing member of the crystal resonator according to the first embodiment.

The first sealing member 3 is made of a material having the flexural rigidity (moment of inertia of area×Young's modulus) of not more than 1000 [N·mm$^2$]. Specifically, as shown in FIGS. 3 and 4, the first sealing member 3 is a substrate having a rectangular parallelepiped shape that is made of a single glass wafer. A second main surface 312 (a surface to be bonded to the crystal resonator plate 2) of the first sealing member 3 is formed as a smooth flat surface (mirror finished).

On the second main surface 312 of the first sealing member 3, a sealing-member-side first sealing part 32 is disposed so as to be bonded to the crystal resonator plate 2. A sealing-member-side first bonding pattern 321 is formed on the sealing-member side first sealing part 32 so as to be bonded to the crystal resonator plate 2. The sealing-member-side first bonding pattern 321 is formed so as to have an annular shape in plan view.

The sealing-member-side first bonding pattern 321 is constituted of a base PVD film 3211 deposited on the first sealing member 3 by the physical vapor deposition, and an electrode PVD film 3212 deposited on the base PVD film 3211 by the physical vapor deposition. In this embodiment, the base PVD film 3211 is made of Ti, and the electrode PVD film 3212 is made of Au. Also, the sealing-member-side first bonding pattern 321 does not contain Sn.

A shown in FIGS. 3 and 4, on the first main surface 311 (the surface on which the IC chip 5 is mounted) of the first sealing member 3, six electrode patterns 37 are formed, which include mounting pads for mounting the IC chip 5 as an oscillation circuit element. In FIG. 3, the region on which the IC chip 5 is mounted is virtually shown as the dashed line. These six electrode patterns 37 are connected, respectively, to the sixth to eleventh through holes 116 to 121.

In the first sealing member 3, the six through holes (the sixth to eleventh through holes 116 to 121) are formed so as to penetrate between a first main surface 311 and the second main surface 312. The sixth to ninth through holes 116 to 119 are respectively disposed at the four corners (corner parts) of the first sealing member 3. The tenth and eleventh through holes 120 and 121 are disposed on both side in the A2 direction in FIG. 4.

The sixth through hole 116 is connected to the first through hole 111 of the crystal resonator plate 2. The seventh through hole 117 is connected to the second through hole 112 of the crystal resonator plate 2. The eighth through hole 118 is connected to the third through hole 113 of the crystal resonator plate 2. The ninth through hole 119 is connected to the fourth through hole 114 of the crystal resonator plate 2. The tenth through hole 120 is connected to the fifth through hole 115 of the crystal resonator plate 2 via the wiring pattern 33. The eleventh through hole 121 is connected to the first extraction electrode 223 drawn from the first excitation electrode 221.

In the sixth to eleventh through holes 116 to 121, through electrodes 116a to 121a are respectively formed along a corresponding inner wall surface of the sixth to eleventh through holes 116 to 121 so as to establish conduction between the electrodes formed on the first main surface 311 and the second main surface 312. Respective central parts of the sixth to eleventh through holes 116 to 121 are hollow through parts 116b to 121b penetrating between the first main surface 311 and the second main surface 312. Connection bonding patterns 116c to 121c are formed on respective outer peripheries of the sixth to eleventh through holes 116 to 121. The connection bonding patterns 116c to 121c are formed on the second main surface 312 of the first sealing member 3.

The connection bonding patterns 116c to 121c have the same configuration as the sealing-member-side first bonding pattern 321, accordingly, they can be formed by the same process as that for the sealing-member-side first bonding pattern 321. Specifically, each of the connection bonding patterns 116c to 121c is constituted of a base PVD film deposited on the second main surface 312 of the first sealing member 3 by the physical vapor deposition, and an electrode PVD film deposited on the base PVD film by the physical vapor deposition.

The connection bonding patterns 116c to 119c of the sixth to ninth through holes 116 to 119 are respectively provided at the four corners (corner parts) of the second main surface 312 of the first sealing member 3 so that they are provided at a predetermined interval from the sealing-member-side first bonding pattern 321. The connection bonding pattern 120c of the tenth through hole 120 extends in the A1 direction in FIG. 4, and it is integrally formed with the wiring pattern 33. Also on the second main surface 312 of the first sealing member 3, a connection bonding pattern 138 is disposed on the side opposite to the connection bonding pattern 120c in the A2 direction with the wiring pattern 33 being interposed therebetween. That is, the connection bonding pattern 120c is connected to one end of the wiring pattern 33 in the A2 direction while the connection bonding pattern 138 is connected to the other end thereof. Note that the A1 direction and the A2 direction in FIG. 4 respectively correspond to the X axis direction and the Z' axis direction in FIG. 5.

Also on the second main surface 312 of the first sealing member 3, connection bonding patterns 139 and 140 are provided on regions close to the respective long sides (regions along the respective long sides) of the first sealing member 3. The connection bonding patterns 139 and 140 extend in the A2 direction in FIG. 4. The connection bonding pattern 139 is disposed between the connection bonding pattern 116c and the connection bonding pattern 118c formed on the second main surface 312 of the first sealing member 3. The connection bonding pattern 140 is disposed between the connection bonding pattern 117c and the connection bonding pattern 119c.

In the crystal resonator 101, the sixth to ninth through holes 116 to 119 and the connection bonding patterns 116c to 119c, 139 and 140 are disposed outside the outer periphery of the sealing-member-side first bonding pattern 321. The tenth and eleventh through holes 120 and 121 and the connection bonding patterns 120c, 121c and 138 are disposed inside the inner periphery of the sealing-member-side first bonding pattern 321. The connection bonding patterns 116c to 121c and 138 to 140 are not electrically connected to the sealing-member-side first bonding pattern 321. Also, the wiring pattern 33 is not electrically connected to the sealing-member-side first bonding pattern 321.

Figure 7:
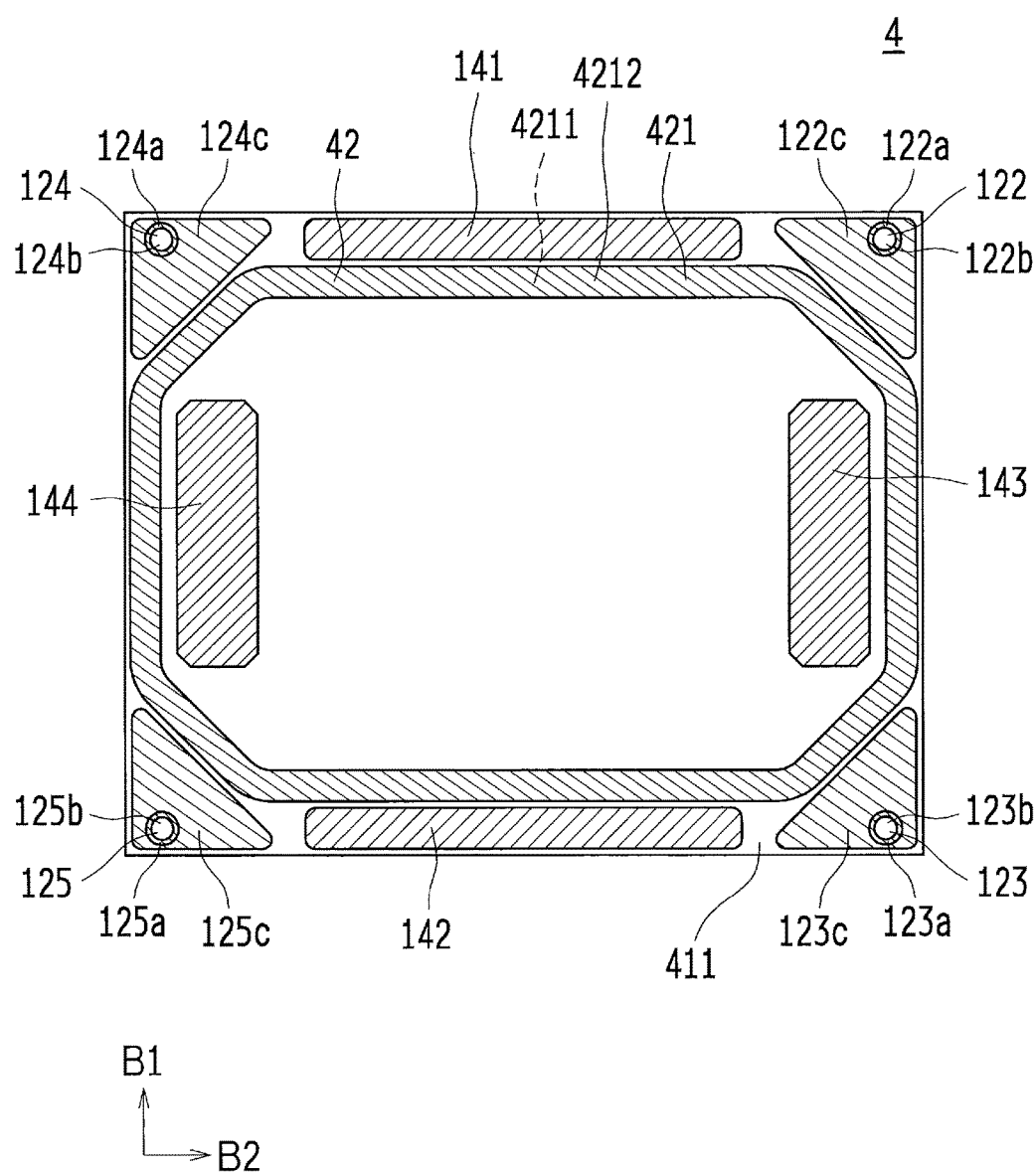
FIG. 7 is a schematic plan view illustrating a second sealing member of the crystal resonator according to the first embodiment.
Figure 8:
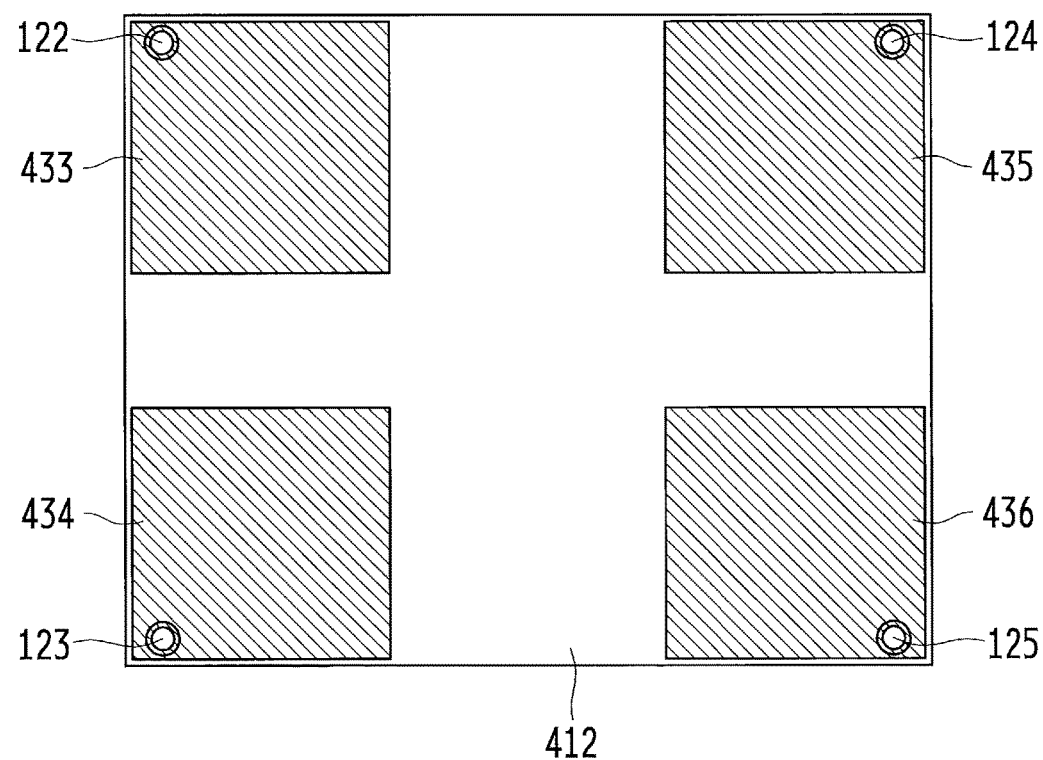
FIG. 8 is a schematic rear view illustrating the second sealing member of the crystal resonator according to the first embodiment.

The second sealing member 4 is made of a material having the flexural rigidity (moment of inertia of area× Young's modulus) of not more than 1000 [N·mm²]. Specifically, as shown in FIGS. 7 and 8, the second sealing member 4 is a substrate having a rectangular parallelepiped shape that is made of a single glass wafer. A first main surface 411 (a surface to be bonded to the crystal resonator plate 2) of the second sealing member 4 is formed as a smooth flat surface (mirror finished).

On the first main surface 411 of the second sealing member 4, a sealing-member-side second sealing part 42 is disposed so as to be bonded to the crystal resonator plate 2. A sealing-member-side second bonding pattern 421 is formed on the sealing-member-side second sealing part 42 so as to be bonded to the crystal resonator plate 2. The sealing-member-side second bonding pattern 421 is formed so as to have an annular shape in plan view.

The sealing-member-side second bonding pattern 421 is constituted of a base PVD film 4211 deposited on the second sealing member 4 by the physical vapor deposition, and an electrode PVD film 4212 deposited on the base PVD film 4211 by the physical vapor deposition. In this embodiment, the base PVD film 4211 is made of Ti, and the electrode PVD film 4212 is made of Au. Also, the sealing-member-side second bonding pattern 421 does not contain Sn.

Four external electrode terminals (first to fourth external electrode terminals 433 to 436), which are electrically connected to the outside, are formed on a second main surface 412 (the outer main surface not facing the crystal resonator plate 2) of the second sealing member 4. The first to fourth external electrode terminals 433 to 436 are respectively located at four corner (corner parts) of the second sealing member 4. These external electrode terminals (the first to fourth external electrode terminals 433 to 436) are each constituted of a base PVD film deposited on the second main surface 412 by the physical vapor deposition, and an electrode PVD film deposited on the base PVD film by the physical vapor deposition.

As shown in FIGS. 7 and 8, four through holes (the twelfth to fifteenth through holes 122 to 125) are formed in the second sealing member 4 so as to penetrate between the first main surface 411 and the second main surface 412. The twelfth to fifteenth through holes 122 to 125 are respectively disposed at the four corners (corner parts) of the second sealing member 4. The twelfth through hole 122 is connected to the first external electrode terminal 433 and to the first through hole 111 of the crystal resonator plate 2. The thirteenth through hole 123 is connected to the second external electrode terminal 434 and to the second through hole 112 of the crystal resonator plate 2. The fourteenth through hole 124 is connected to the third external electrode terminal 435 and to the third through hole 113 of the crystal resonator plate 2. The fifteenth through hole 125 is connected to the fourth external electrode terminal 436 and to the fourth through hole 114 of the crystal resonator plate 2.

In the twelfth to fifteenth through holes 122 to 125, through electrodes 122a to 125a are respectively formed along a corresponding inner wall surface of the twelfth to fifteenth through holes 122 to 125 so as to establish conduction between the electrodes formed on the first main surface 411 and the second main surface 412. Respective central parts of the twelfth to fifteenth through holes 122 to 125 are hollow through parts 122b to 125b penetrating between the first main surface 411 and the second main surface 412. Connection bonding patterns 122c to 125c are formed on respective outer peripheries of the twelfth to fifteenth through holes 122 to 125. The connection bonding patterns 122c to 125c are formed on the first main surface 411 of the second sealing member 4.

The connection bonding patterns 122c to 125c have the same configuration as the sealing-member-side second bonding pattern 421, accordingly, they can be formed by the same process as that for the sealing-member-side second bonding pattern 421. Specifically, each of the connection bonding patterns 122c to 125c is constituted of a base PVD film deposited on the first main surface 411 of the second sealing member 4 by the physical vapor deposition, and an electrode PVD film deposited on the base PVD film by the physical vapor deposition.

The connection bonding patterns 122c to 125c of the twelfth to fifteenth through holes 122 to 125 are respectively provided at the four corners (corner parts) of the first main surface 411 of the second sealing member 4 so that they are provided at a predetermined interval from the sealing-member-side second bonding pattern 421. Also, on the first main surface 411 of the second sealing member 4, connection bonding patterns 141 and 142 are provided on regions close to the respective long sides (regions along the respective long sides) of the second sealing member 4. The connection bonding patterns 141 and 142 extend in the B2 direction in FIG. 7. The connection bonding pattern 141 is disposed between the connection bonding pattern 122c and the connection bonding pattern 124c formed on the first main surface 411 of the second sealing member 4. The connection bonding pattern 142 is disposed between the connection bonding pattern 123c and the connection bonding pattern 125c.

Also on the first main surface 411 of the second sealing member 4, connection bonding patterns 143 and 144 are provided so as to extend in the B1 direction in FIG. 7. The connection bonding patterns 143 and 144 are respectively disposed on both end parts in the B2 direction in FIG. 7. The connection bonding pattern 143 is disposed between the connection bonding pattern 122c and the connection bonding pattern 123c formed on the first main surface 411 of the second sealing member 4. The connection bonding pattern 144 is disposed between the connection bonding pattern 124c and the connection bonding pattern 125c. Note that the B1 direction and the B2 direction in FIG. 7 respectively correspond to the X axis direction and the Z' axis direction in FIG. 5.

In the crystal resonator 101, the twelfth to fifteenth through holes 122 to 125 and the connection bonding patterns 122c to 125c, 141 and 142 are disposed outside the outer periphery of the sealing-member-side second bonding pattern 421. The connection bonding patterns 143 and 144 are disposed inside the inner periphery of the sealing-member-side second bonding pattern 421. The connection bonding patterns 122c to 125c and 141 to 144 are not electrically connected to the sealing-member-side second bonding pattern 421.

In the crystal resonator 101 including the crystal resonator plate 2, the first sealing member 3 and the second sealing member 4, the crystal resonator plate 2 and the first sealing member 3 are subjected to the diffusion bonding in a state in which the resonator-plate-side first bonding pattern 251 and the sealing-member-side first bonding pattern 321 are overlapped with each other, and the crystal resonator plate 2 and the second sealing member 4 are subjected to the diffusion bonding in a state in which the resonator-plate-side second bonding pattern 252 and the sealing-member-side second bonding pattern 421 are overlapped with each other, thus, the package 12 having the sandwich structure is produced. Thus, the internal space 13 of the package 12, i.e. the space to house the vibrating part 22 is hermetically sealed without using, separately, any special bonding material such as an adhesive.

As shown in FIG. 1, the resonator-plate-side first bonding pattern 251 and the sealing-member-side first bonding pattern 321 themselves serve as a bonding material 15a formed upon the diffusion bonding. The resonator-plate-side second bonding pattern 252 and the sealing-member-side second bonding pattern 421 themselves serve as a bonding material 15b formed upon the diffusion bonding.

In this case, the respective connection bonding patterns as described above are also subjected to the diffusion bonding in a state in which they are each overlapped with the corresponding connection bonding pattern. Specifically, the connection bonding patterns 111c to 114c at the four corners of the crystal resonator plate 2 and the connection bonding patterns 116c to 119c at the four corners of the first sealing member 3 are subjected to the diffusion bonding. The connection bonding patterns 133 and 134 on the regions close to the respective long sides of the crystal resonator plate 2 and the connection bonding patterns 139 and 140 on the regions close to the respective long sides of the first sealing member 3 are subjected to the diffusion bonding. The connection bonding pattern 115c of the crystal resonator plate 2 and the connection bonding pattern 138 of the first sealing member 3 are subjected to the diffusion bonding. The connection bonding pattern 131 of the crystal resonator plate 2 and the connection bonding pattern 121c of the first sealing member 3 are subjected to the diffusion bonding. The connection bonding pattern 132 of the crystal resonator plate 2 and the connection bonding pattern 120c of the first sealing member 3 are subjected to the diffusion bonding. The bonding materials formed by the above connection bonding patterns themselves upon the diffusion bonding serve to establish conduction between the through electrodes of the through holes, and to hermetically seal the bonding parts.

Similarly to the above, the connection bonding patterns 111c to 114c at the four corners of the crystal resonator plate 2 and the connection bonding patterns 122c to 125c at the four corners of the second sealing member 4 are subjected to the diffusion bonding. The connection bonding patterns 136 and 137 on the regions close to the respective long sides of the crystal resonator plate 2 and the connection bonding patterns 141 and 142 on the regions close to the respective long sides of the second sealing member 4 are subjected to the diffusion bonding. The connection bonding pattern 115c of the crystal resonator plate 2 and the connection bonding pattern 144 of the second sealing member 4 are subjected to the diffusion bonding. The connection bonding pattern 135 of the crystal resonator plate 2 and the connection bonding pattern 143 of the second sealing member 4 are subjected to the diffusion bonding.

The crystal resonator 101 according to this embodiment is intended to be mounted on the electric circuit board by solder mounting. Thus, as shown in FIG. 1, plating films (electroless plating films) 51 are respectively formed on the first to fourth external electrode terminals 433 to 436 on the second main surface 412 of the second sealing member 4. From the viewpoint of the solder mounting to the electric circuit board, the plating film is required to be formed on only the first to fourth external electrode terminals 433 to 436. However, in the crystal resonator 101 according to this embodiment, plating films 52 are also formed on the electrode patterns 37 on the first main surface 311 of the first sealing member 3.

The plating films 51 and 52 are formed by the electroless plating method after the crystal resonator plate 2, the first sealing member 3 and the second sealing member 4 are bonded to one another. That is, the crystal resonator 101 made up of the crystal resonator plate 2, the first sealing member 3 and the second sealing member 4 bonded to one another is immersed in a plating solution so as to be plated. In this way, since the entire crystal resonator 101 is immersed in the plating solution, it is possible to plate the first to fourth external electrode terminals 433 to 436 and the electrode patterns 37 at the same time.

The plating films 51 and 52 are respectively formed on the first to fourth external electrode terminals 433 to 436 or the electrode patterns 37 as the base patterns. Specifically, a Ni (nickel) film, a Pd (palladium) film and an Au (gold) film are laminated in this order from the side close to the base pattern. The Ni film has a film thickness in the range from 1.0 to 10.0 µm, and preferably in the range from 5.0 to 7.5 µm. When the film thickness of the Ni film is within the above-described range, it is possible to obtain a sufficient bonding strength for solder bonding and further to prevent the stress causing warpage from increasing due to an unnecessarily large film thickness of the electroless plating film. The Pd film has a film thickness of about 0.05 µm, and the Au film has a film thickness of about 0.05 µm.

A lead-free solder has been more and more used in recent years because it has little effect on the environment. In order to obtain an excellent bondability of the lead-free solder, the presence of the plating film on the external electrode terminal is important. Specifically, in the case that the lead-free solder is used, Ni is likely to disperse in the solder (or in Sn contained in the solder). When the dispersion of Ni in the solder advances, the solder may strip. As described above, since the plating films 51 and 52 are each made to have the laminated structure of the Ni film, Pd film and Au film, the Pd film is interposed between the solder and the Ni film, thus the Pd film serves as a barrier film to prevent the dispersion of Ni in the solder.

Also, it is preferable that the first to fourth external electrode terminals 433 to 436 and the electrode patterns 37, which are the base patterns of the plating films 51 and 52, are each a Ti—Au film similarly to the above-described bonding patterns (i.e. the resonator-plate-side first bonding pattern 251, the resonator-plate-side second bonding pattern 252, the sealing-member-side first bonding pattern 321, the sealing-member-side second bonding pattern 421 and the respective connection bonding patterns). That is, it is preferable that the base PVD films formed on the first main surface 311 of the first sealing member 3 and on the second main surface 412 of the second sealing member 4 are made of Ti while the electrode films deposited on the respective base PVD films are made of Au.

In this way, by forming the Ti—Au films as the base patterns of the plating films 51 and 52 similarly to the other bonding patterns, it is possible to simplify the processes. For example, when the films are formed using a sputtering apparatus, it is possible to form, at the same time, the base patterns of the plating films 51 and 52 and the other bonding patterns on the front and rear surfaces of the respective first and second sealing members 3 and 4. When a vacuum deposition apparatus is used, the films are formed on the front and rear surfaces sequentially reversed, however, since the films to be formed have the same film configuration, it is possible to manufacture the films continuously and efficiently without changing any materials to form the films.

A Cu film is generally used as the base pattern for the electroless plating. However, the Cu film is corroded with an alkaline developer during the photolithography step. Also, the Cu film is dissolved in an iodine-based Au metal etching solution. For these reasons, when a Cu—Au film is used as the base pattern and the Cu film and the Au film are intended to be simultaneously patterned, the conventional method (i.e. method for manufacturing the piezoelectric resonator device without forming any plating film) should be considerably modified. The base pattern of Ti—Au layer can avoid such a problem.

In the piezoelectric resonator device to which the package having the sandwich structure is adopted, the device is thinned compared to devices having the conventional structure. Thus, when the plating films for solder mounting are formed on one surface, a problem of warpage emerges due to stress caused by the plating films. In contrast, in the crystal resonator 101 according to this embodiment, not only the plating films 51 are formed on the first to fourth external electrode terminals 433 to 436 on the second main surface 412 of the second sealing member 4, but also the plating films 52 are formed on the electrode patterns 37 on the first main surface 311 of the first sealing member 3. That is, the plating films 51 and 52 are respectively formed on both the first sealing member 3 and the second sealing member 4, on the respective surfaces thereof opposite to the surfaces to be bonded to the crystal resonator plate 2. In this way, since the plating films 51 and 52 are formed on both surfaces of the crystal resonator 101, the stress is offset, which results in reduction in warpage.

In the crystal resonator 101, the plating film 51 formed on the second main surface 412 of the second sealing member 4 and the plating film 52 formed on the first main surface 311 of the first sealing member 3 normally differ from each other in the shape as well as in the area. That is, in the present invention, the plating films formed on both surfaces of the crystal resonator 101 are not needed to have the same shape and the same area. Also the plating films are not required to completely offset the stress caused by themselves. It is possible to reduce the warpage if the stress can be offset to a certain extent. Also, if the plating films 51 and 52 formed on the first to fourth external electrode terminals 433 to 436 and the electrode patterns 37 are not sufficient to reduce the warpage, a further plating film may be formed as a dummy pattern so that this plating film as the dummy pattern improves an inhibitory effect of the warpage.

Also, the piezoelectric resonator device generally has castellation on the side surface of the device so as to establish conduction between electrodes. However, the crystal resonator 101 does not have the castellation, and the through holes (the first to fifteenth through holes 111 to 125) are used for conduction between the electrodes. This is because the structure including the castellation leads to increased width and depth of the device due to increase of the film thickness of the castellation by the electroless plating. In the crystal resonator 101, the through holes are used to establish conduction between the electrodes so that the castellation is not provided, which can avoid increase in width and depth of the device. Also, when the plating films 51 and 52 are formed, unevenness around each through hole serves as a core of growth of the film. Thus, an effect of stable formation of the film on the Au film as the surface of the base pattern can be expected. Also, there is a method in which a small number of Pd fine particles are adhered onto the Au film before the plating is performed, in order to stably form the electroless plating film (here, Ni film) on the Au film.

In the crystal resonator 101, all pads and terminals respectively have the through holes. When the plating films 51 and 52 are formed, the plating films are also formed inside the respective through holes. Thus, conductivity of the through holes can be improved. In addition, since the plating films formed inside the through holes are connected to the plating films 51 and 52, an anchor effect is exerted on the plating films 51 and 52 so as to ensure the strength of the plating films 51 and 52.

As shown in FIG. 2, the crystal oscillator 102 is constituted of the crystal resonator 101 and the IC chip 5 mounted on the crystal resonator 101. In this case, the electrode patterns 37 are used as mounting terminals and wiring to mount the IC chip 5. The IC chip 5 is bonded to the electrode patterns 37 using metal bumps (for example, Au bumps) 38. In the conventional crystal oscillator, the IC chip is mounted on the crystal resonator generally by the flip chip bonding (FCB) method. In the crystal oscillator 102, the plating films 52 are formed on the electrode patterns 37, however, the presence of the plating films 52 does not cause any particular problem when the IC chip 5 is mounted on the crystal resonator 101 by the FCB method.

Second Embodiment

The crystal resonator 101 and the crystal oscillator 102 according to the first embodiment as described above are intended to be mounted on the electric circuit board by solder mounting, and they exemplarily show the structure in which the plating films are formed on the external electrode terminals. A crystal resonator 101' and a crystal oscillator 102' according to the second embodiment are also intended to be mounted by solder mounting. However, the structure as exemplarily shown here is not the structure in which the plating films are formed on the external electrode terminals as the base, but the structure in which the external electrode terminals themselves are metal laminated films formed by sputtering.

Figure 9:
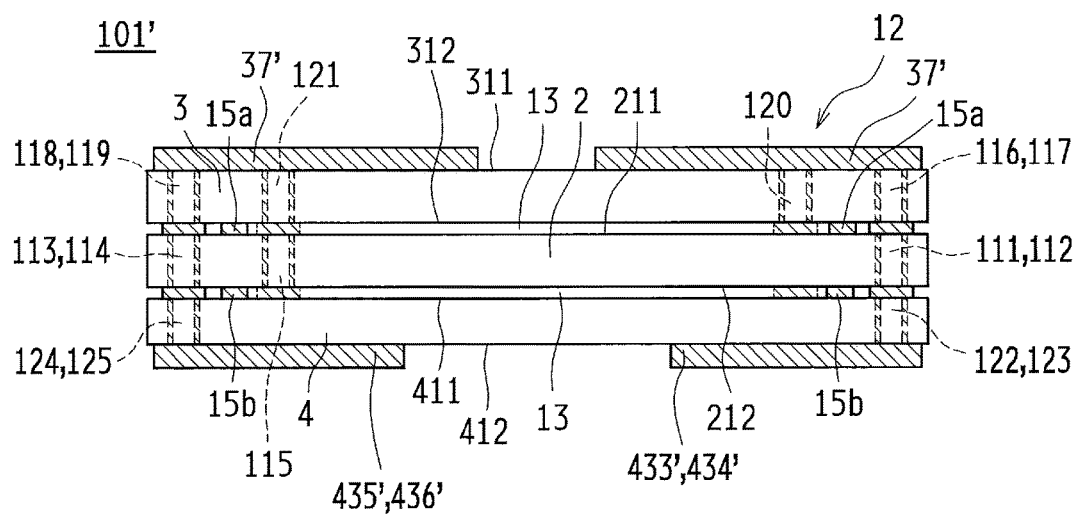
FIG. 9 is a schematic configuration diagram schematically illustrating a configuration of a crystal resonator according to the second embodiment.
Figure 10:
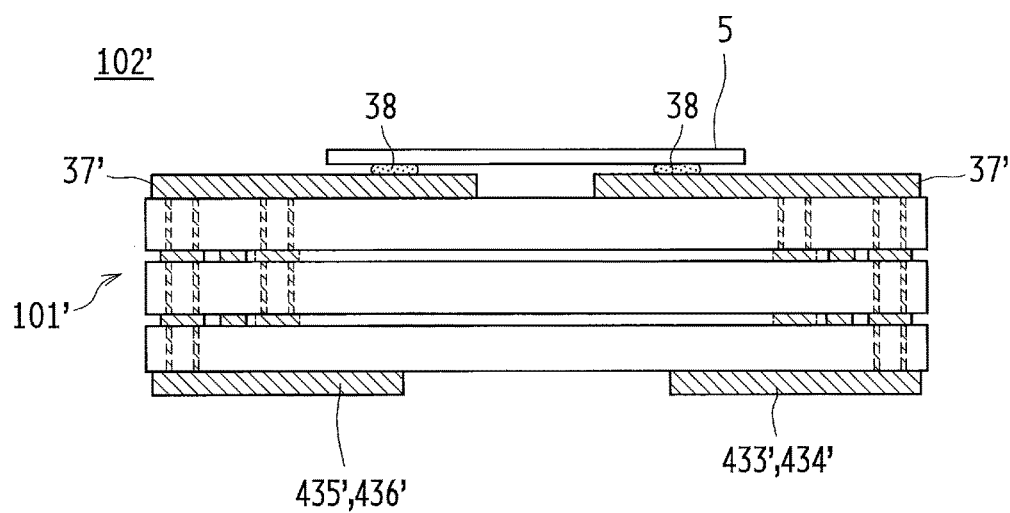
FIG. 10 is a schematic configuration diagram schematically illustrating a configuration of a crystal oscillator according to the second embodiment.

FIG. 9 is a schematic configuration diagram schematically illustrating the configuration of a crystal resonator 101' according to the second embodiment. FIG. 10 is a schematic configuration diagram schematically illustrating the configuration of the crystal oscillator 102' according to the second embodiment. In the crystal resonator 101' and the crystal oscillator 102' according to the second embodiment, electrode patterns 37' each made of a metal laminated film are formed, in place of the electrode patterns 37 and the plating films 52, on the first main surface 311 of the first sealing member 3. Also, first to fourth external electrode terminals 433' to 436' each made of a metal laminated film are formed, in place of the first to fourth external electrode terminals 433 to 436 and the plating films 51, on the second main surface 412 of the second sealing member 4. The respective configurations other than the above are the same as the configurations of the crystal resonator 101 and the crystal oscillator 102 according to the first embodiment.

Figure 11:
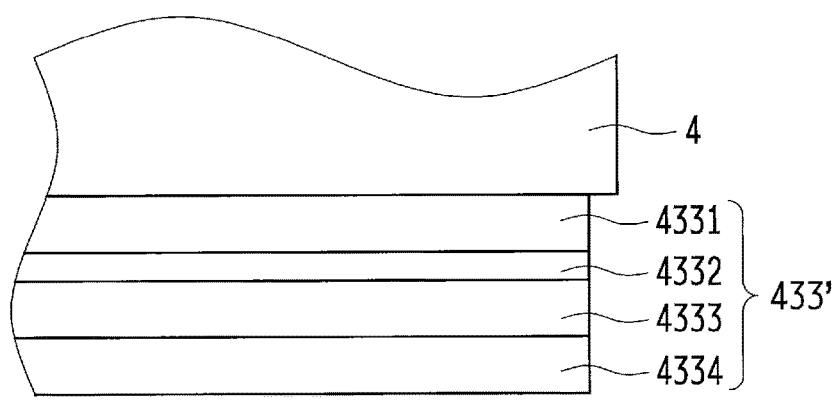
FIG. 11 is a cross-sectional view specifically illustrating a structure of an external electrode terminal of the crystal resonator according to the second embodiment.

FIG. 11 is a cross-sectional view specifically illustrating the structure of the first external electrode terminal 433'. Here, the first external electrode terminal 433' is exemplarily described, because the electrode patterns 37' and the second to fourth external electrode terminals 434' to 436' each have the same configuration as that of the first external electrode terminal 433'.

In the second embodiment, the first external electrode terminal 433' has a four-layer structure constituted of a base layer 4331, a barrier (diffusion preventing) layer 4332, a soldering layer 4333 and a protective layer 4334 in this order from the side close to the second sealing member 4. This layer structure is formed using the film forming step by sputtering and the patterning step by etching.

The first to fourth external electrode terminals 433' to 436' are metal laminated films in consideration of excellent soldering when the crystal resonator 101' or the crystal oscillator 102' is mounted on the electric circuit board by solder mounting. It was confirmed, by the study of the inventor of the present invention, that the excellent soldering property can be obtained while deterioration after the mounting can be reduced when the base layer 4331 is made of Ti, the barrier layer 4332 is made of $TiO_2$, the soldering layer 4333 is made of NiTi and the protective layer 4334 is made of Au.

In the first to fourth external electrode terminals 433' to 436' having the above-described configuration, the metal layers other than the protective layer 4334 (i.e. the base layer 4331, the barrier layer 4332 and the soldering layer 4333) all contain Ti. In this case, the three layers containing Ti can be collectively subjected to the patterning step by etching, which simplifies the producing processes.

In the crystal resonator 101' and the crystal oscillator 102' according to the second embodiment, not only the first to fourth external electrode terminals 433' to 436' on the second main surface 412 of the second sealing member 4 are formed as the above-described metal laminated films, but also the electrode patterns 37' on the first main surface 311 of the first sealing member 3 are formed as the metal laminated films each having the same film configuration and the same film thickness as the first to fourth external electrode terminals 433' to 436'. That is, the metal laminated films each having the same configuration are respectively formed on both the first sealing member 3 and the second sealing member 4, on the respective surfaces thereof opposite to the surfaces to be bonded to the crystal resonator plate 2. In this way, since the metal laminated films are formed on both surfaces of the crystal resonator 101', the stress is offset, which results in reduction in warpage.

Third Embodiment

The crystal resonator 101 and the crystal oscillator 102 according to the first embodiment as described above are intended to be mounted on the electric circuit board by solder mounting, and they exemplarily show the structure in which the plating films are formed on the external electrode terminals. The crystal resonator 101" and the crystal oscillator 102" according to the third embodiment are also intended to form the plating films.

In the piezoelectric resonator device having a sandwich structure, respective annular bonding patterns made of a metal are formed between the first sealing member and the piezoelectric resonator plate that are to be bonded to each other, and between the piezoelectric resonator plate and the second sealing member that are to be bonded to each other. Thus, a space inside the inner periphery of each bonding pattern is hermetically sealed. Also, when the external electrode terminals are formed, by electroless plating, on the piezoelectric resonator device having the sandwich structure, it is preferable that the three wafers (i.e. the first sealing member, the second sealing member and the piezoelectric resonator plate) are bonded to one another in advance, and then such bonded wafers are immersed in the plating solution so as to be plated.

However, when the device after the wafers are bonded is immersed in the plating solution, the plating solution also enters gaps among the bonded wafers. In this case, if a conductive part constituting part of the wiring exists on the outer peripheral side of the bonding pattern, a metal may precipitate from the plating solution entering the vicinity of the conductive part, which may cause connection failure.

In consideration of the above, the crystal resonator 101" and the crystal oscillator 102" according to the third embodiment have a characteristic configuration to avoid the connection failure caused by precipitation of the plating metal.

Hereinafter, the embodiment of the present invention will be described with reference to the drawings.

Figure 12:
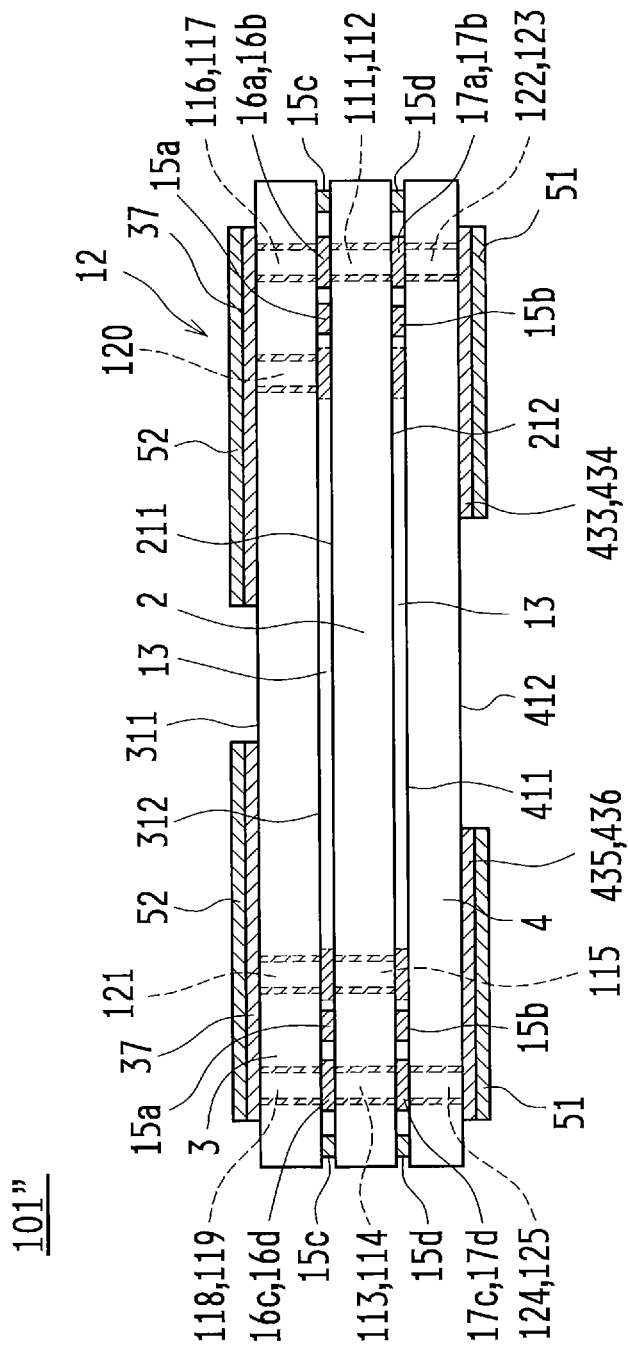
FIG. 12 is a schematic configuration diagram schematically illustrating a configuration of a crystal resonator according to the third embodiment.
Figure 13:
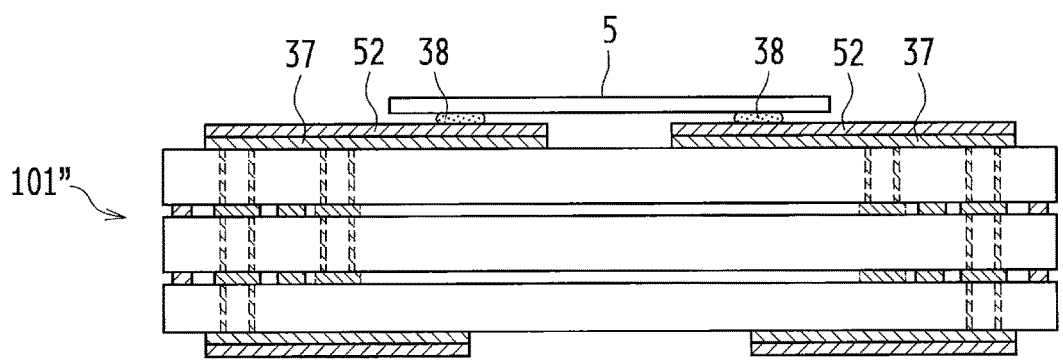
FIG. 13 is a schematic configuration diagram schematically illustrating a configuration of a crystal oscillator according to the third embodiment.

FIG. 12 is a schematic configuration diagram schematically illustrating the configuration of the crystal resonator 101". FIG. 13 is a schematic configuration diagram schematically illustrating the configuration of the crystal oscillator 102". As shown in FIG. 13, the crystal oscillator 102" is constituted of the crystal resonator 101" in FIG. 12 and the IC chip 5 mounted on the crystal resonator 101". First, the configuration of the crystal resonator 101" according to this embodiment is described.

—Crystal Resonator—

As shown in FIG. 12, the crystal resonator 101" according to this embodiment includes: the crystal resonator plate (the piezoelectric resonator plate) 2; the first sealing member 3; and the second sealing member 4. In the crystal resonator 101", the crystal resonator plate 2 is bonded to the first sealing member 3, and also the crystal resonator plate 2 is bonded to the second sealing member 4. Thus, the package 12 having a sandwich structure is constituted.

Next, the specific configuration of the above-described crystal resonator 101" is described referring to FIGS. 12 and 14 to 19. Here, each of the crystal resonator plate 2, the first sealing member 3 and the second sealing member 4 will be described as a single member. Since the crystal resonator 101" according to the third embodiment has a configuration similar to that of the crystal resonator 101 according to the first embodiment, the common configuration with the crystal oscillator 101 of the first embodiment is indicated by the same reference numerals, and the description thereof is properly omitted.

Figure 16:
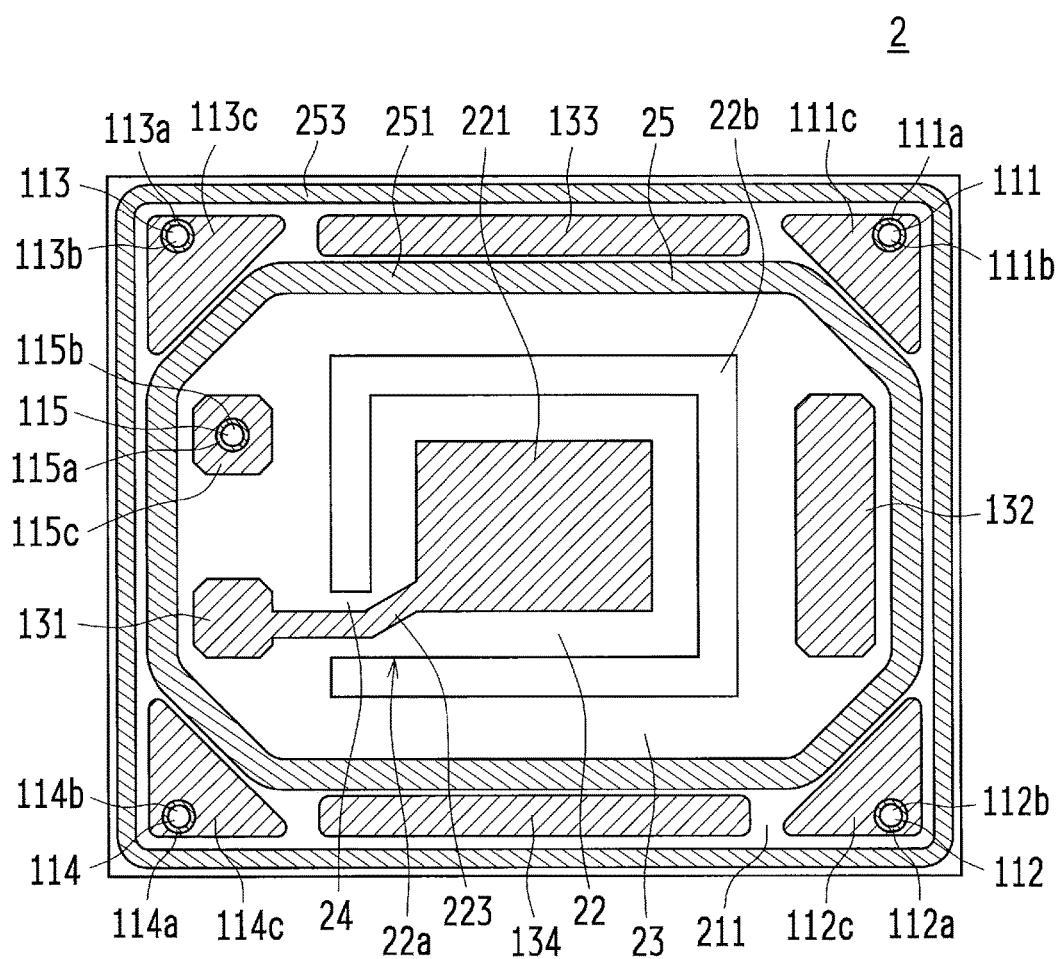
FIG. 16 is a schematic plan view illustrating a crystal resonator plate of the crystal resonator according to the third embodiment.
Figure 17:
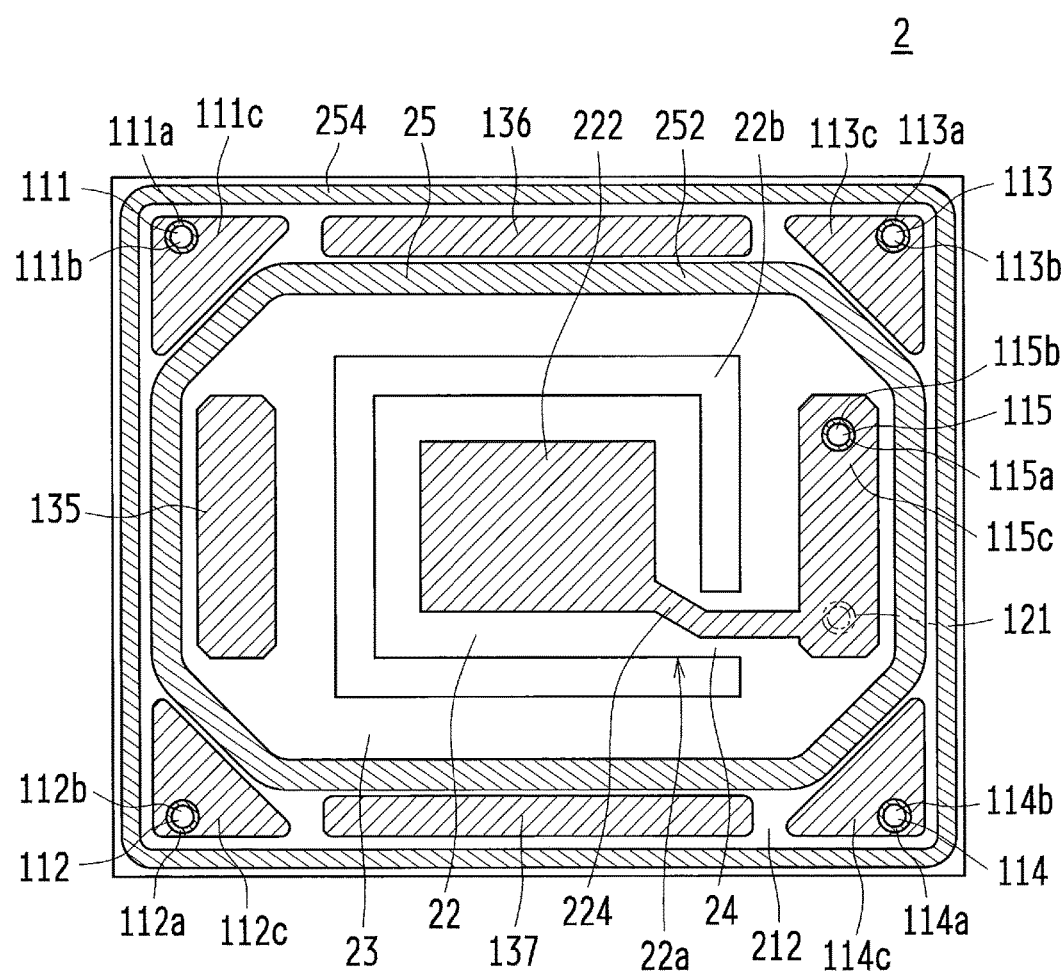
FIG. 17 is a schematic rear view illustrating the crystal resonator plate of the crystal resonator according to the third embodiment.

The crystal resonator plate 2 is a piezoelectric substrate made of crystal. As shown in FIGS. 16 and 17, both main surfaces 211 and 212 are formed as smooth flat surfaces (mirror-finished). In this embodiment, an AT-cut crystal plate that causes thickness shear vibration is used as the crystal resonator plate 2.

The resonator-plate-side sealing parts 25 to bond the crystal resonator plate 2 respectively to the first sealing member 3 and to the second sealing member 4 are provided on the respective main surfaces 211 and 212 of the crystal resonator plate 2. The resonator-plate-side sealing parts 25 include: the resonator-plate-side first bonding pattern 251 and a resonator-plate-side third bonding pattern 253 formed on the first main surface 211 of the crystal resonator plate 2; and the resonator-plate-side second bonding pattern 252 and a resonator-plate-side fourth bonding pattern 254 formed on the second main surface 212 of the crystal resonator plate 2. The resonator-plate-side first bonding pattern 251 and the resonator-plate-side second bonding pattern 252 are each formed on the external frame part 23 so as to each have an annular shape in plan view. The resonator-plate-side third bonding pattern 253 and the resonator-plate-side fourth bonding pattern 254 are formed on the external frame part 23, respectively outside the outer peripheries of the resonator-plate-side first bonding pattern 251 and the resonator-plate-side second bonding pattern 252, so as to each have an annular shape in plan view. The first excitation electrode 221 and the second excitation electrode 222 are not electrically connected to the resonator-plate-side first bonding pattern 251 and the resonator-plate-side second bonding pattern 252.

The resonator-plate-side first bonding pattern 251 and the resonator-plate-side third bonding pattern 253 are each constituted of a base PVD film deposited on the first main surface 211 by the physical vapor deposition, and an electrode PVD film deposited on the base PVD film by the physical vapor deposition. The resonator-plate-side second bonding pattern 252 and the resonator-plate-side fourth bonding pattern 254 are each constituted of a base PVD film deposited on the second main surface 212 by the physical vapor deposition, and an electrode PVD film deposited on the base PVD film by the physical vapor deposition.

That is, the resonator-plate-side first bonding pattern 251 to the resonator-plate-side fourth bonding pattern 254 have the same configuration in which a plurality of layers is laminated on each main surface 211 and 212, specifically, a Ti (titanium) layer and an Au (gold) layer are deposited by vapor deposition in this order from the lowermost layer side. Like this, in each of the resonator-plate-side first bonding pattern 251 to the resonator-plate-side fourth bonding pattern 254, the base PVD film is made of a single material (Ti), the electrode PVD film is made of a single material (Au), and the electrode PVD film has a thickness greater than the thickness of the base PVD film. The first excitation electrode 221, the resonator-plate-side first bonding pattern 251 and the resonator-plate-side third bonding pattern 253 all formed on the first main surface 211 of the crystal resonator plate 2 have the same thickness, and the surfaces thereof are made of the same metal. Similarly to the above, the second excitation electrode 222, the resonator-plate-side second bonding pattern 252 and the resonator-plate-side fourth bonding pattern 254 all formed on the second main surface 212 of the crystal resonator plate 2 have the same thickness, and the surfaces thereof are made of the same metal. The resonator-plate-side first bonding pattern 251 to the resonator-plate-side fourth bonding pattern 254 do not contain Sn.

Here, the first excitation electrode 221, the first extraction electrode 223, the resonator-plate-side first bonding pattern 251 and the resonator-plate-side third bonding pattern 253 can have the same configuration so that they are collectively formed in the same process. Similarly to the above, the second excitation electrode 222, the second extraction electrode 224, the resonator-plate-side second bonding pattern 252 and the resonator-plate-side fourth bonding pattern 254 can have the same configuration so that they are collectively formed in the same process. More specifically, the base PVD films and the electrode PVD films are formed using a PVD method (for example, a film forming method for patterning in processing such as photolithography) such as vacuum deposition, sputtering, ion plating, molecular beam epitaxy (MBE) and laser ablation. Thus, it is possible to form the films collectively, which leads to reduction in producing processes and in cost.

The connection bonding patterns 111c to 115c have the same configuration as the resonator-plate-side first bonding pattern 251 to the resonator-plate-side fourth bonding pattern 254, accordingly, they can be formed by the same process as that for the resonator-plate-side first bonding pattern 251 to the resonator-plate-side fourth bonding pattern 254. Specifically, each of the connection bonding patterns 111c to 115c is constituted of a base PVD film deposited on each main surface (the first main surface 211 and the second main surface 212) of the crystal resonator plate 2 by the physical vapor deposition, and an electrode PVD film deposited on the base PVD film by the physical vapor deposition.

The connection bonding patterns 111c to 114c formed on both first main surface 211 and second main surface 212 of the crystal resonator plate 2 are respectively provided at the four corners (corner parts) of the crystal resonator plate 2, outside the outer peripheries of the resonator-plate-side first bonding pattern 251 and the resonator-plate-side second bonding pattern 252, so that they are provided at a predetermined interval from the resonator-plate-side first bonding pattern 251 and the resonator-plate-side second bonding pattern 252. Furthermore, the resonator-plate-side third bonding pattern 253 and the resonator-plate-side fourth bonding pattern 254 are disposed outside the outer peripheries of the connection bonding patterns 111c to 114c so that the resonator-plate-side third bonding pattern 253 and the resonator-plate-side fourth bonding pattern 254 surround the connection bonding patterns 111c to 114c respectively at positions spaced apart from the connection bonding patterns 111c to 114c by a predetermined distance. The connection bonding pattern 115c formed on the second main surface 212 of the crystal resonator plate 2 extends on the external frame part 23 of the crystal resonator plate 2 in the X axis direction, and it is integrally formed with the second extraction electrode 224 drawn from the second excitation electrode 222.

In the crystal resonator 101", the first to fourth through holes 111 to 114 and the connection bonding patterns 111c to 114c, 133, 134, 136 and 137 are disposed outside the outer peripheries of the resonator-plate-side first bonding pattern 251 and the resonator-plate-side second bonding pattern 252 and furthermore inside the inner peripheries of the resonator-plate-side third bonding pattern 253 and the resonator-plate-side fourth bonding pattern 254. The fifth through hole 115 and the connection bonding patterns 115c, 131, 132 and 135 are disposed inside the inner peripheries of the resonator-plate-side first bonding pattern 251 and the resonator-plate-side second bonding pattern 252. The connection bonding patterns 111c to 115c and 131 to 137 are not electrically connected to the resonator-plate-side first bonding pattern 251 to the resonator-plate-side fourth bonding pattern 254.

Figure 14:
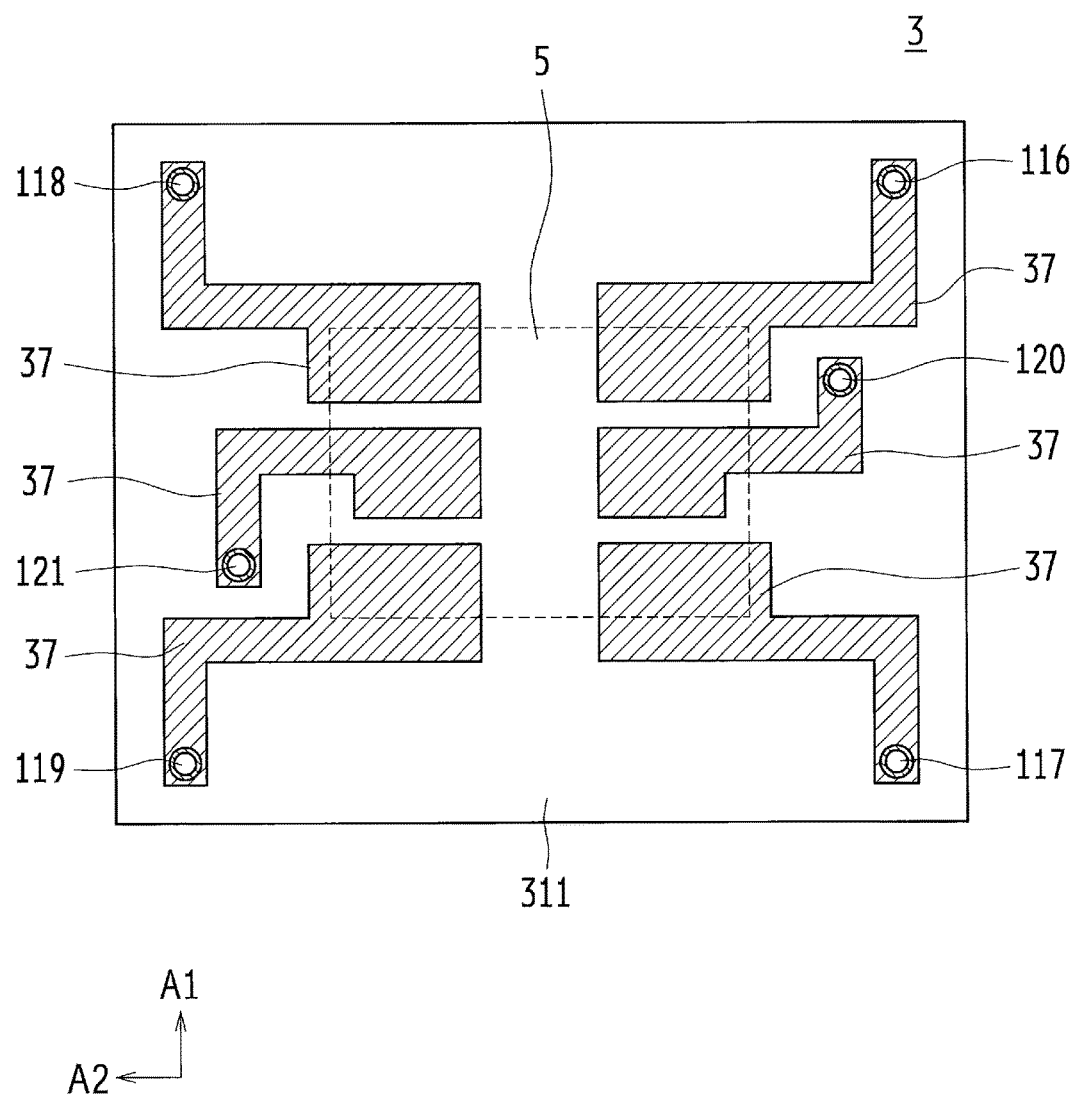
FIG. 14 is a schematic plan view illustrating a first sealing member of the crystal resonator according to the third embodiment.
Figure 15:
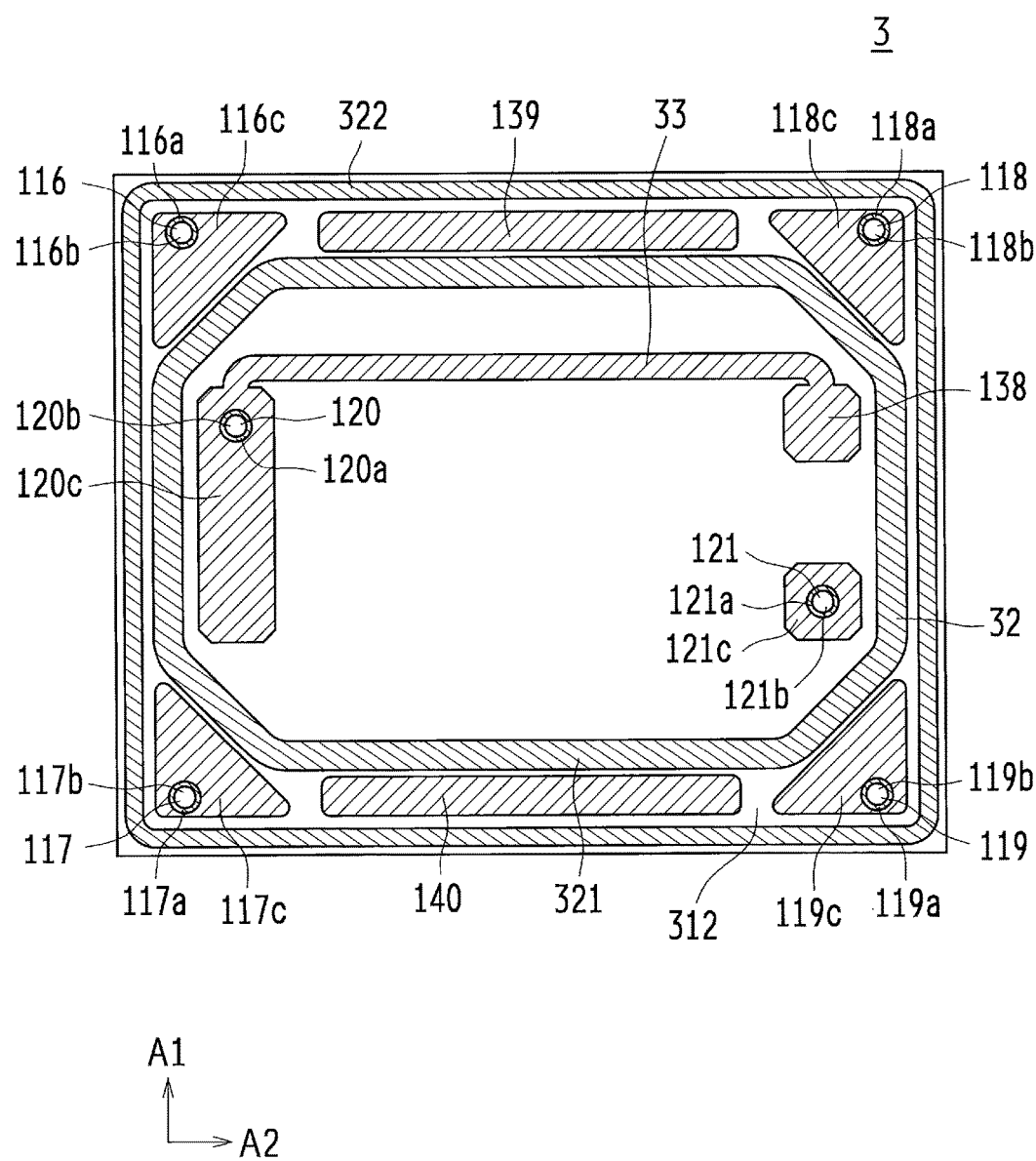
FIG. 15 is a schematic rear view illustrating the first sealing member of the crystal resonator according to the third embodiment.

The first sealing member 3 is made of a material having the flexural rigidity (moment of inertia of area×Young's modulus) of not more than 1000 [N·mm$^2$]. Specifically, as shown in FIGS. 14 and 15, the first sealing member 3 is a substrate having a rectangular parallelepiped shape that is made of a single glass wafer. The second main surface 312 (the surface to be bonded to the crystal resonator plate 2) of the first sealing member 3 is formed as a smooth flat surface (mirror finished).

On the second main surface 312 of the first sealing member 3, the sealing-member-side first sealing parts 32 are disposed so as to be bonded to the crystal resonator plate 2. The sealing-member-side first bonding pattern 321 and a sealing-member-side third bonding pattern 322 are formed on the respective sealing-member side first sealing parts 32 so as to be bonded to the crystal resonator plate 2. The sealing-member-side first bonding pattern 321 is formed so as to have an annular shape in plan view. The sealing-member-side third bonding pattern 322 is disposed outside the outer periphery of the sealing-member-side first bonding pattern 321 so as to have an annular shape in plan view.

The sealing-member-side first bonding pattern 321 and the sealing-member-side third bonding pattern 322 are each constituted of a base PVD film deposited on the first sealing member 3 by the physical vapor deposition, and an electrode PVD film deposited on the base PVD film by the physical vapor deposition. In this embodiment, the base PVD film is made of Ti, and the electrode PVD film is made of Au. Also, the sealing-member-side first bonding pattern 321 and the sealing-member-side third bonding pattern 322 do not contain Sn.

The connection bonding patterns 116c to 121c have the same configuration as the sealing-member-side first bonding pattern 321 and the sealing-member-side third bonding pattern 322, accordingly, they can be formed by the same process as that for the sealing-member-side first bonding pattern 321 and the sealing-member-side third bonding pattern 322. Specifically, each of the connection bonding patterns 116c to 121c is constituted of a base PVD film deposited on the second main surface 312 of the first sealing member 3 by the physical vapor deposition, and an electrode PVD film deposited on the base PVD film by the physical vapor deposition.

The connection bonding patterns 116c to 119c formed on the second main surface 312 of the first sealing member 3 are respectively provided at the four corners (corner parts) of the first sealing member 3, outside the outer periphery of the sealing-member-side first bonding pattern 321, so that they are provided at a predetermined interval from the sealing-member-side first bonding pattern 321. Furthermore, the sealing-member-side third bonding pattern 322 is disposed outside the outer peripheries of the connection bonding patterns 116c to 119c so that the sealing-member-side third bonding pattern 322 surrounds the connection bonding patterns 116c to 119c at a position spaced apart from the connection bonding patterns 116c to 119c by a predetermined distance.

In the crystal resonator 101", the sixth to ninth through holes 116 to 119 and the connection bonding patterns 116c to 119c, 139 and 140 are disposed outside the outer periphery of the sealing-member-side first bonding pattern 321 and furthermore inside the inner periphery of the sealing-member-side third bonding pattern 322. The tenth and eleventh through holes 120 and 121 and the connection bonding patterns 120c, 121c and 138 are disposed inside the inner periphery of the sealing-member-side first bonding pattern 321. The connection bonding patterns 116c to 121c and 138 to 140 are not electrically connected to the sealing-member-side first bonding pattern 321 and the sealing-member-side third bonding pattern 322. Also, the wiring pattern 33 is not electrically connected to the sealing-member-side first bonding pattern 321 and the sealing-member-side third bonding pattern 322.

Figure 18:
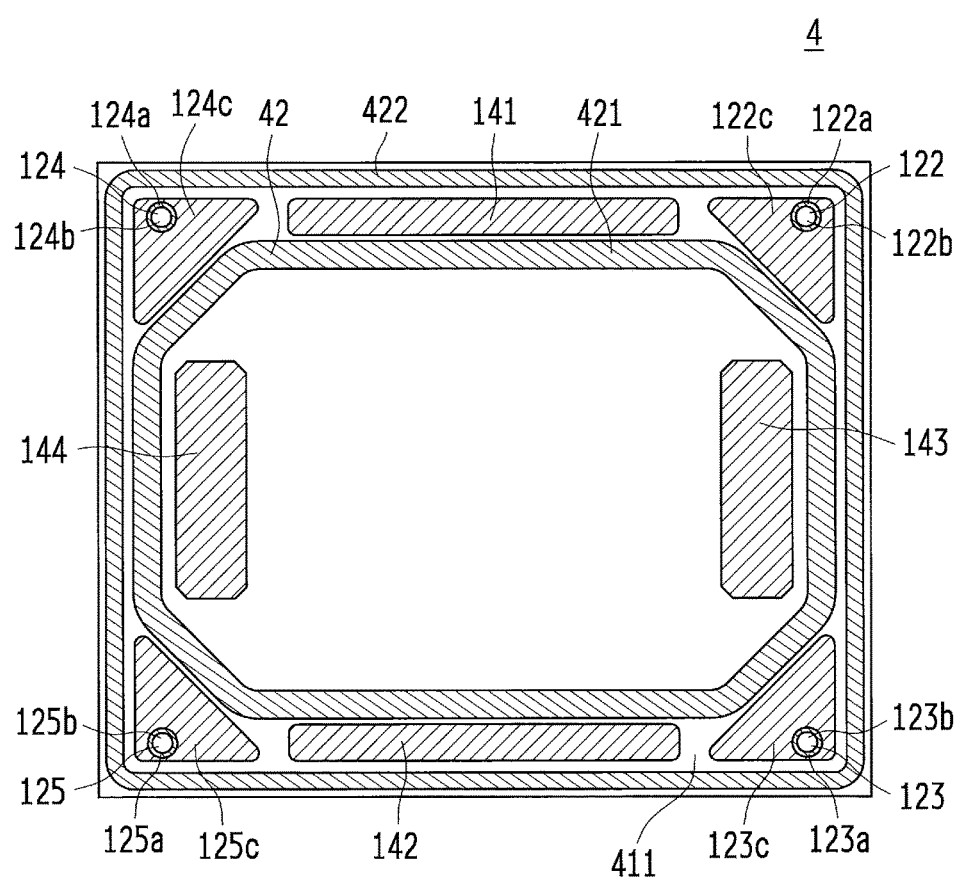
FIG. 18 is a schematic plan view illustrating a second sealing member of the crystal resonator according to the third embodiment.
Figure 19:
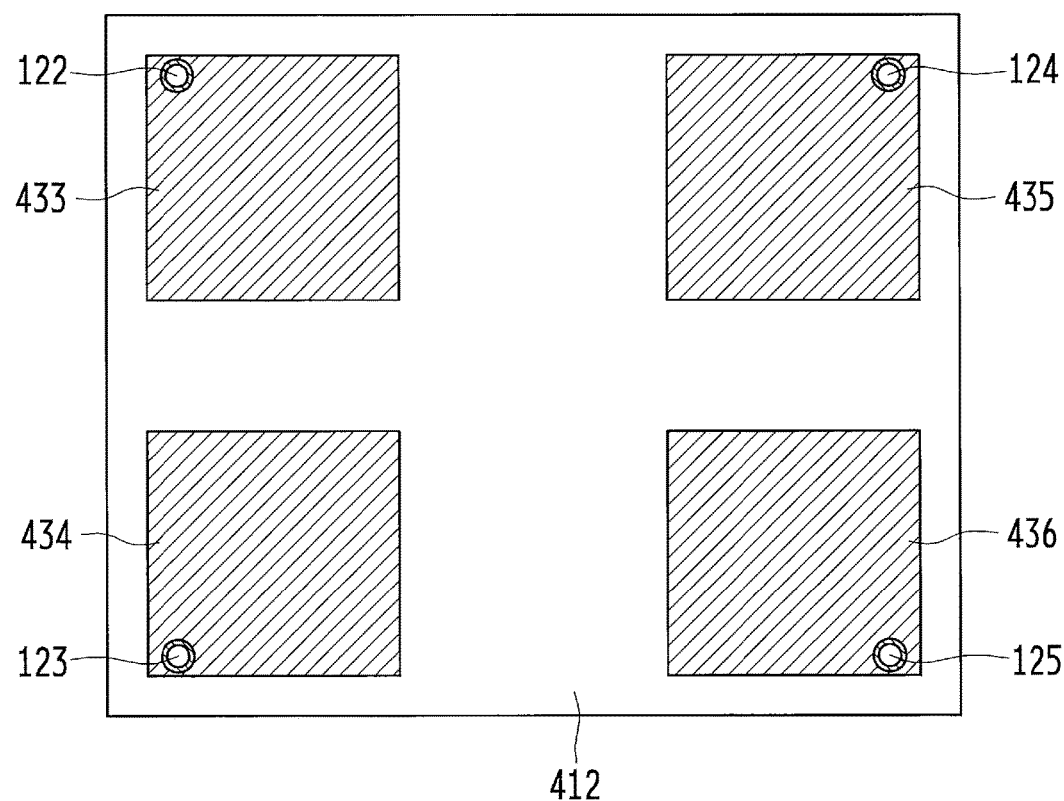
FIG. 19 is a schematic rear view illustrating the second sealing member of the crystal resonator according to the third embodiment.

The second sealing member 4 is made of a material having the flexural rigidity (moment of inertia of area× Young's modulus) of not more than 1000 [N·mm$^2$]. Specifically, as shown in FIGS. 18 and 19, the second sealing member 4 is a substrate having a rectangular parallelepiped shape that is made of a single glass wafer. The first main surface 411 (the surface to be bonded to the crystal resonator plate 2) of the second sealing member 4 is formed as a smooth flat surface (mirror finished).

On the first main surface 411 of the second sealing member 4, the sealing-member-side second sealing parts 42 are disposed so as to be bonded to the crystal resonator plate 2. The sealing-member-side second bonding pattern 421 and a sealing-member-side fourth bonding pattern 422 are formed on the respective sealing-member side second sealing parts 42 so as to be bonded to the crystal resonator plate 2. The sealing-member-side second bonding pattern 421 is formed so as to have an annular shape in plan view. The sealing-member-side fourth bonding pattern 422 is disposed outside the outer periphery of the sealing-member-side second bonding pattern 421 so as to have an annular shape in plan view.

The sealing-member-side second bonding pattern 421 and the sealing-member-side fourth bonding pattern 422 are each constituted of a base PVD film deposited on the second sealing member 4 by the physical vapor deposition, and an electrode PVD film deposited on the base PVD film by the physical vapor deposition. In this embodiment, the base PVD film is made of Ti, and the electrode PVD film is made of Au. Also, the sealing-member-side second bonding pattern 421 and the sealing-member-side fourth bonding pattern 422 do not contain Sn.

The connection bonding patterns 122c to 125c have the same configuration as the sealing-member-side second bonding pattern 421 and the sealing-member-side fourth bonding pattern 422, accordingly, they can be formed by the same process as that for the sealing-member-side second bonding pattern 421 and the sealing-member-side fourth bonding pattern 422. Specifically, each of the connection bonding patterns 122c to 125c is constituted of a base PVD film deposited on the first main surface 411 of the second sealing member 4 by the physical vapor deposition, and an electrode PVD film deposited on the base PVD film by the physical vapor deposition.

The connection bonding patterns 122c to 125c formed on the first main surface 411 of the second sealing member 4 are respectively provided at the four corners (corner parts) of the second sealing member 4, outside the outer periphery of the sealing-member-side second bonding pattern 421, so that they are provided at a predetermined interval from the sealing-member-side second bonding pattern 421. The sealing-member-side fourth bonding pattern 422 is disposed outside the outer peripheries of the connection bonding patterns 122c to 125c so that the sealing-member-side fourth bonding pattern 422 surrounds the connection bonding patterns 122c to 125c at a position spaced apart from the connection bonding patterns 122c to 125c by a predetermined distance.

In the crystal resonator 101", the twelfth to fifteenth through holes 122 to 125 and the connection bonding patterns 122c to 125c, 141 and 142 are disposed outside the outer periphery of the sealing-member-side second bonding pattern 421 and furthermore inside the inner periphery of the sealing-member-side fourth bonding pattern 422. The connection bonding patterns 143 and 144 are disposed inside the inner periphery of the sealing-member-side second bonding pattern 421. The connection bonding patterns 122c to 125c and 141 to 144 are not electrically connected to the sealing-member-side second bonding pattern 421 and the sealing-member-side fourth bonding pattern 422. In the crystal resonator 101", the crystal resonator plate 2, the first sealing member 3 and the second sealing member 4 are bonded to one another in the manner described below so that the package 12 having the sandwich structure is manufactured. That is, the crystal resonator plate 2 and the first sealing member 3 are subjected to diffusion bonding in a state in which the resonator-plate-side first bonding pattern 251 and the sealing-member-side first bonding pattern 321 are overlapped with each other while the resonator-plate-side third bonding pattern 253 and the sealing-member-side third bonding pattern 322 are overlapped with each other. Also, the crystal resonator plate 2 and the second sealing member 4 are subjected to the diffusion bonding in a state in which the resonator-plate-side second bonding pattern 252 and the sealing-member-side second bonding pattern 421 are overlapped with each other while the resonator-plate-side fourth bonding pattern 254 and the sealing-member-side fourth bonding pattern 422 are overlapped with each other. Thus, the internal space 13 of the package 12, i.e. the space to house the vibrating part 22 is hermetically sealed without using, separately, any special bonding material such as an adhesive.

As shown in FIG. 12, between the crystal resonator plate 2 and the first sealing member 3, the resonator-plate-side first bonding pattern 251 and the sealing-member-side first bonding pattern 321 themselves serve as the bonding material 15a formed upon the diffusion bonding while the resonator-plate-side third bonding pattern 253 and the sealing-member-side third bonding pattern 322 themselves serve as a bonding material 15c formed upon the diffusion bonding. Also, between the crystal resonator plate 2 and the second sealing member 4, the resonator-plate-side second bonding pattern 252 and the sealing-member-side second bonding pattern 421 themselves serve as the bonding material 15b formed upon the diffusion bonding while the resonator-plate-side fourth bonding pattern 254 and the sealing-member-side fourth bonding pattern 422 themselves serve as a bonding material 15d formed upon the diffusion bonding. Here, the bonding materials 15a and 15b are each formed as a first annular part having an annular shape so as to surround the vibrating part 22 in plan view and to hermetically seal the vibrating part 22. The bonding materials 15c and 15d are each formed as a second annular part having an annular shape. The bonding materials 15c and 15d as the second annular parts are disposed outside the respective outer peripheries of bonding materials 16a to 16d and 17a to 17d so as to surround the bonding materials 16a to 16d and 17a to 17d at respective positions spaced apart from the bonding materials 16a to 16d and 17a to 17d by a predetermined distance.

The bonding materials 15a to 15d are formed so that the bonding materials 15a and 15b are located at substantially the same position while the bonding materials 15c and 15d are located at substantially the same position, in plan view. Specifically, the inner peripheral edges and the outer peripheral edges of the bonding materials 15a and 15b are located respectively at substantially the same positions while the inner peripheral edges and the outer peripheral edges of the bonding materials 15c and 15d are located respectively at substantially the same positions. By bonding the respective bonding patterns in a pressurized state, it is possible to improve the bonding strength of the bonding materials 15a to 15d.

In this case, the respective connection bonding patterns as described above are also subjected to the diffusion bonding in a state in which they are each overlapped with the corresponding connection bonding pattern. Specifically, the connection bonding patterns 111c to 114c at the four corners of the crystal resonator plate 2 and the connection bonding patterns 116c to 119c at the four corners of the first sealing member 3 are subjected to the diffusion bonding. The connection bonding patterns 111c to 114c and the connection bonding patterns 116c to 119c themselves serve as the bonding materials 16a to 16d respectively formed upon the diffusion bonding. The connection bonding patterns 133 and 134 on the regions close to the respective long sides of the crystal resonator plate 2 and the connection bonding patterns 139 and 140 on the regions close to the respective long sides of the first sealing member 3 are subjected to the diffusion bonding. The connection bonding pattern 115c of the crystal resonator plate 2 and the connection bonding pattern 138 of the first sealing member 3 are subjected to the diffusion bonding. The connection bonding pattern 131 of the crystal resonator plate 2 and the connection bonding pattern 121c of the first sealing member 3 are subjected to the diffusion bonding. The connection bonding pattern 132 of the crystal resonator plate 2 and the connection bonding pattern 120c of the first sealing member 3 are subjected to the diffusion bonding. The bonding materials formed by the above connection bonding patterns themselves upon the diffusion bonding serve to establish conduction between the through electrodes of the through holes, and to hermetically seal the bonding parts.

Similarly to the above, the connection bonding patterns 111c to 114c at the four corners of the crystal resonator plate 2 and the connection bonding patterns 122c to 125c at the four corners of the second sealing member 4 are subjected to the diffusion bonding. The connection bonding patterns 111c to 114c and the connection bonding patterns 122c to 125c themselves serve as the bonding materials 17a to 17d respectively formed upon the diffusion bonding. The connection bonding patterns 136 and 137 on the regions close to the respective long sides of the crystal resonator plate 2 and the connection bonding patterns 141 and 142 on the regions close to the respective long sides of the second sealing member 4 are subjected to the diffusion bonding. The connection bonding pattern 115c of the crystal resonator plate 2 and the connection bonding pattern 144 of the second sealing member 4 are subjected to the diffusion bonding. The connection bonding pattern 135 of the crystal resonator plate 2 and the connection bonding pattern 143 of the second sealing member 4 are subjected to the diffusion bonding.

The crystal resonator 101" according to this embodiment is intended to be mounted on the electric circuit board by solder mounting. Thus, as shown in FIG. 12, the plating films 51 are respectively formed on the first to fourth external electrode terminals 433 to 436 on the second main surface 412 of the second sealing member 4. From the viewpoint of the solder mounting to the electric circuit board, the plating film is required to be formed on only the first to fourth external electrode terminals 433 to 436. However, in the crystal resonator 101" according to this embodiment, the plating films 52 may also be formed on the electrode patterns 37 on the first main surface 311 of the first sealing member 3.

As shown in FIG. 13, the crystal oscillator 102" is constituted of the crystal resonator 101" and the IC chip 5 mounted on the crystal resonator 101". In this case, the electrode patterns 37 are used as mounting terminals and wiring to mount the IC chip 5. The IC chip 5 is bonded to the electrode patterns 37 using metal bumps (for example, Au bumps) 38. In the conventional crystal oscillator, the IC chip is mounted on the crystal resonator generally by the flip chip bonding (FCB) method. In the crystal oscillator 102", the plating films 52 are formed on the electrode patterns 37, however, the presence of the plating films 52 does not cause any particular problem when the IC chip 5 is mounted on the crystal resonator 101" by the FCB method.

The plating films 51 and 52 are formed preferably by the electroless plating method after the crystal resonator plate 2, the first sealing member 3 and the second sealing member 4 are bonded to one another. That is, the crystal resonator 101" made up of the crystal resonator plate 2, the first sealing member 3 and the second sealing member 4 bonded to one another is immersed in a plating solution so as to be plated. In this way, since the entire crystal resonator 101" is immersed in the plating solution, it is possible to plate the first to fourth external electrode terminals 433 to 436 and the electrode patterns 37 at the same time.

In this way, when the crystal resonator 101" is immersed in the plating solution, the plating solution also enters gaps among the bonded members (i.e. the crystal resonator plate 2, the first sealing member 3 and the second sealing member 4). In the crystal resonator 101" according to this embodiment, it is possible to prevent connection failure caused by precipitation of the plating metal thanks to the bonding materials 15c and 15d as the second annular parts.

In the crystal resonator 101", the bonding materials 16a to 16d and the bonding materials 17a to 17d as conductive patterns are formed outside the outer peripheries of the bonding materials 15a and 15b as the first annular parts. The bonding materials 16a to 16d and the bonding materials 17a to 17d function as parts of the wiring to electrically connect the electrode patterns 37 on the first main surface 311 of the first sealing member 3 and the first to fourth external electrode terminals 433 to 436 on the second main surface 412 of the second sealing member 4. In other words, the bonding materials 16a to 16d and the bonding materials 17a to 17d electrically connect the through holes (the first to fourth through holes 111 to 114) formed in the crystal resonator plate 2 to the through holes (the sixth to ninth through holes 116 to 119 and the twelfth to fifteenth through holes 122 to 125) formed in the first and second sealing members 3 and 4.

In this case, if the bonding materials 15c and 15d are not formed in the crystal resonator 101", the plating solution enters gaps among the members to reach the vicinities of the bonding materials 16a to 16d and 17a to 17d. When the plating solution enters the vicinities of the bonding materials 16a to 16d and 17a to 17d, a metal precipitates from the plating solution, which may cause connection failure such as short-circuiting between the bonding materials 15a and the bonding materials 16a to 16d, and between the bonding material 15b and bonding materials 17a to 17d.

In contrast to the above, when the bonding materials 15c and 15d are formed, they can prevent the plating solution from entering the vicinities of the bonding materials 16a to 16d and the bonding materials 17a to 17d. In the result, it is possible to prevent the connection failure caused by precipitation of the metal in the vicinities of the bonding materials 16a to 16d and 17a to 17d.

The bonding materials 15a and 15b as the first annular parts are required to have a high sealing property in order to hermetically seal the vibrating part 22 of the crystal resonator plate 2. On the other hand, the bonding materials 15c and 15d as the second annular parts are only required to have a sealing property that can prevent the plating solution from entering. For this reason, the line width of the bonding materials 15c and 15d may be thinner than the line width of the bonding materials 15a and 15b.

The piezoelectric resonator device generally has castellation on the side surface of the device so as to establish conduction between the electrodes. However, the crystal resonator 101" does not have the castellation, and the through holes (the first to fifteenth through holes 111 to 125) are used for conduction between the electrodes. This is because the structure including the castellation leads to increased width and depth of the device due to increase of the film thickness of the castellation by the electroless plating. In the crystal resonator 101", the through holes are used to establish conduction between the electrodes so that the castellation is not provided, which can avoid increase in width and depth of the device.

Also, on the second main surface 312 of the first sealing member 3 and on the first main surface 211 of the crystal resonator plate 2 as shown in FIGS. 15 and 16, the sealing-member-side first bonding pattern 321 and the resonator-plate-side first bonding pattern 251, which become the bonding material 15a, are formed so as to be spaced apart, respectively, from the sealing-member-side third bonding pattern 322 and the resonator-plate-side third bonding pattern 253. Similarly to the above, on the second main surface 212 of the crystal resonator plate 2 and on the first main surface 411 of the second sealing member 4 as shown in FIGS. 17 and 18, the resonator-plate-side second bonding pattern 252 and the sealing-member-side second bonding pattern 421, which become the bonding material 15b, are formed so as to be spaced apart, respectively, from the resonator-plate-side fourth bonding pattern 254 and the sealing-member-side fourth bonding pattern 422. Accordingly, in the crystal resonator 101", the bonding materials 15a and 15b as the first annular parts are formed so as to be spaced apart from the bonding materials 15c and 15d as the second annular parts.

Figure 20:
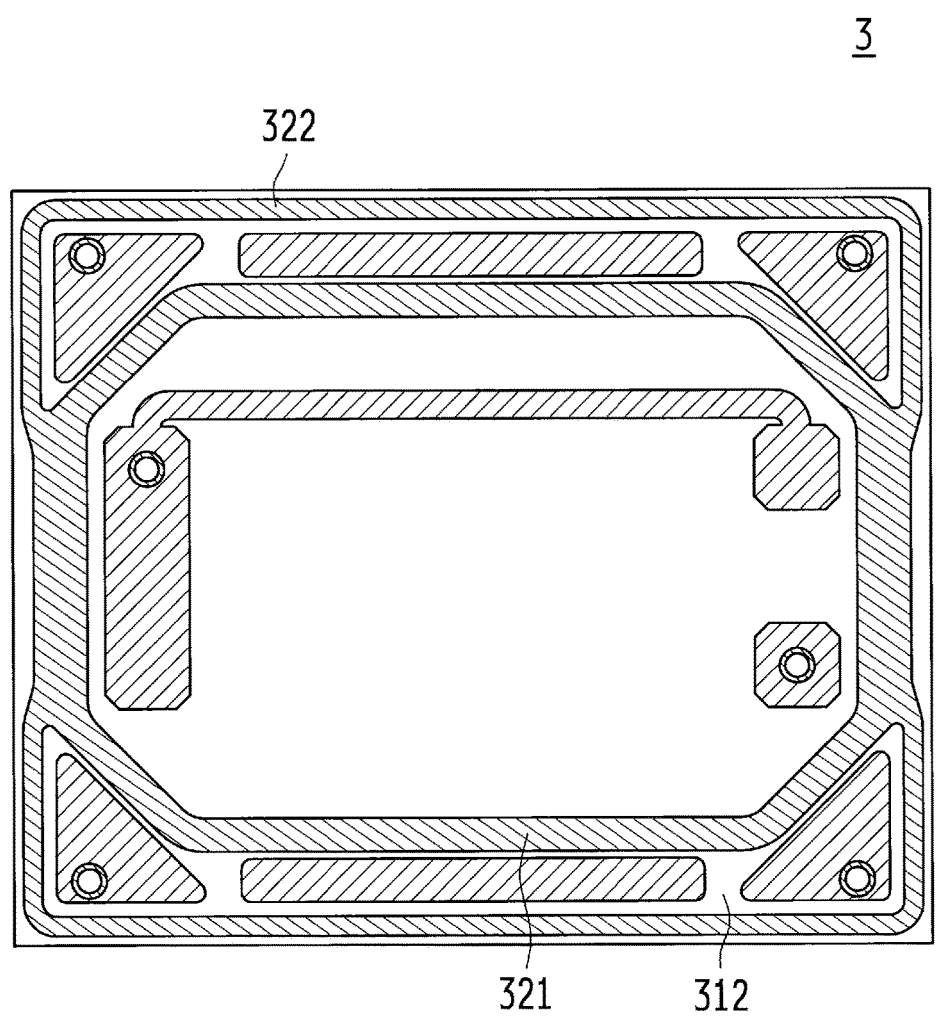
FIG. 20 is a schematic rear view illustrating a variation of the first sealing member of the crystal resonator according to the third embodiment.
Figure 21:
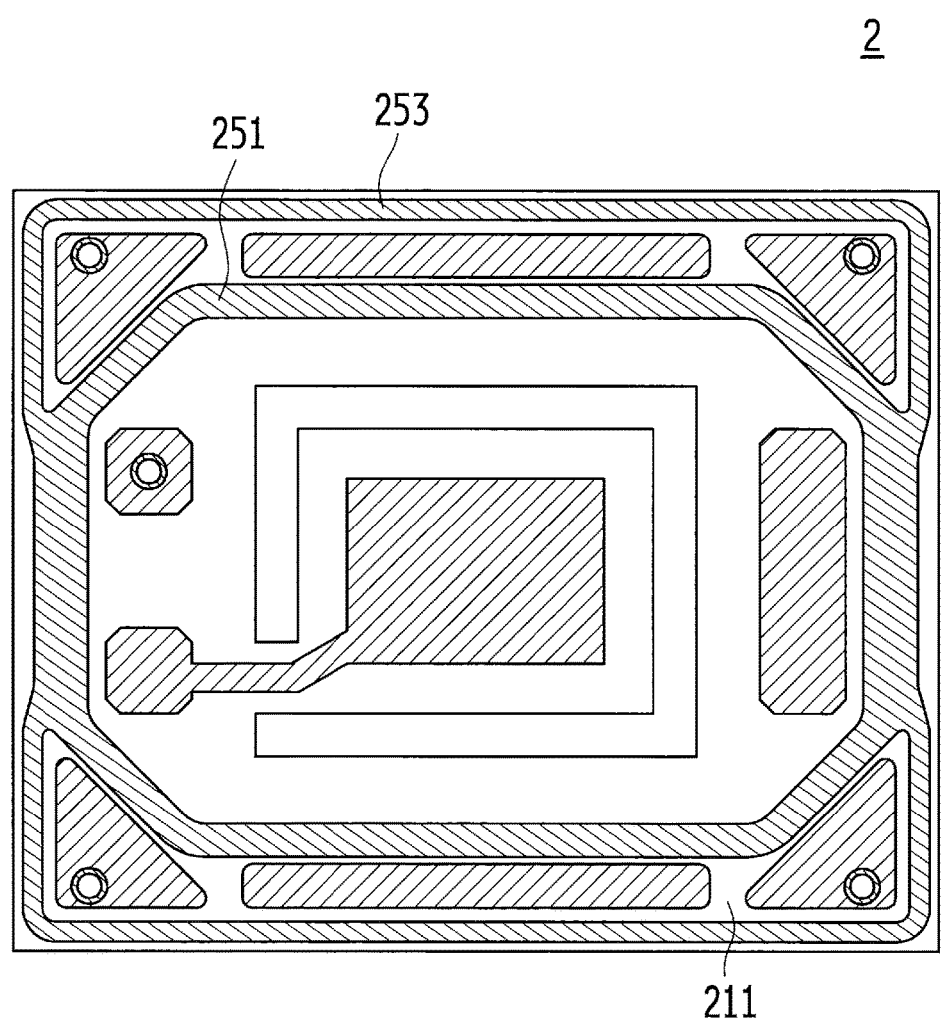
FIG. 21 is a schematic plan view illustrating the variation of the crystal resonator plate of the crystal resonator according to the third embodiment.
Figure 22:
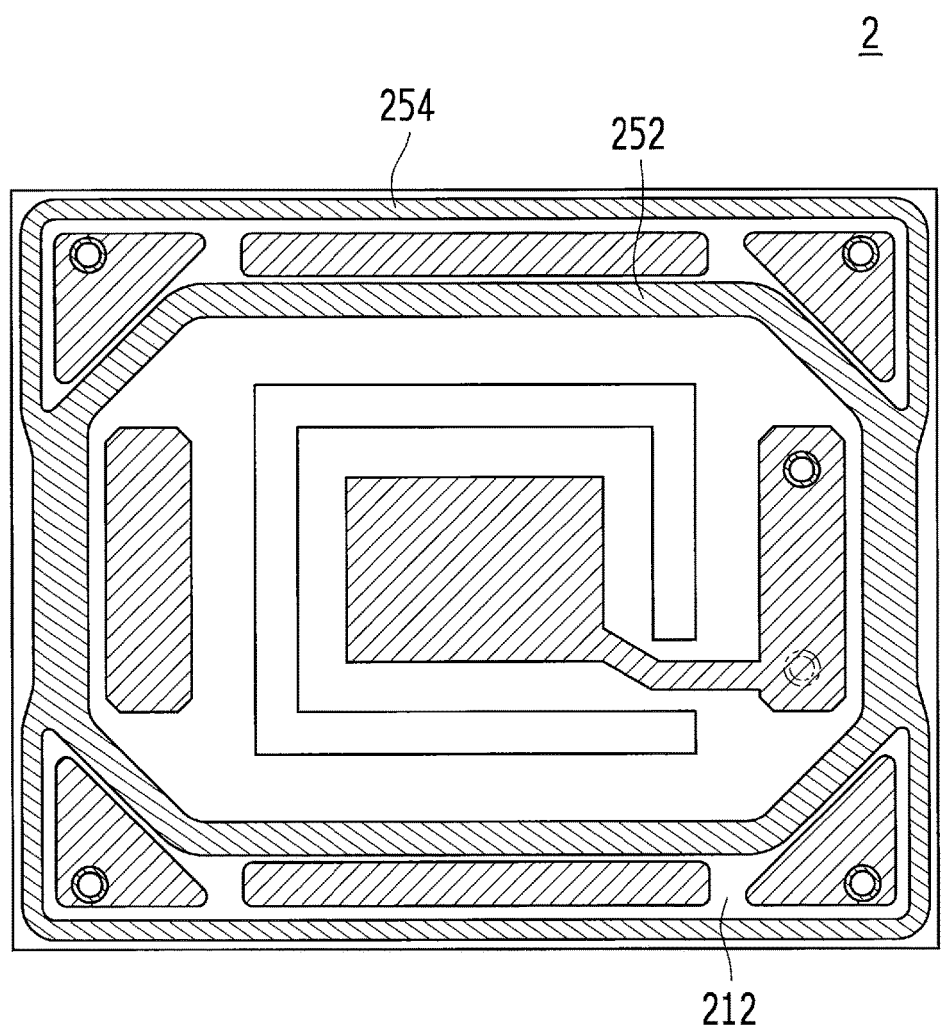
FIG. 22 is a schematic rear view illustrating the variation of the crystal resonator plate of the crystal resonator according to the third embodiment.
Figure 23:
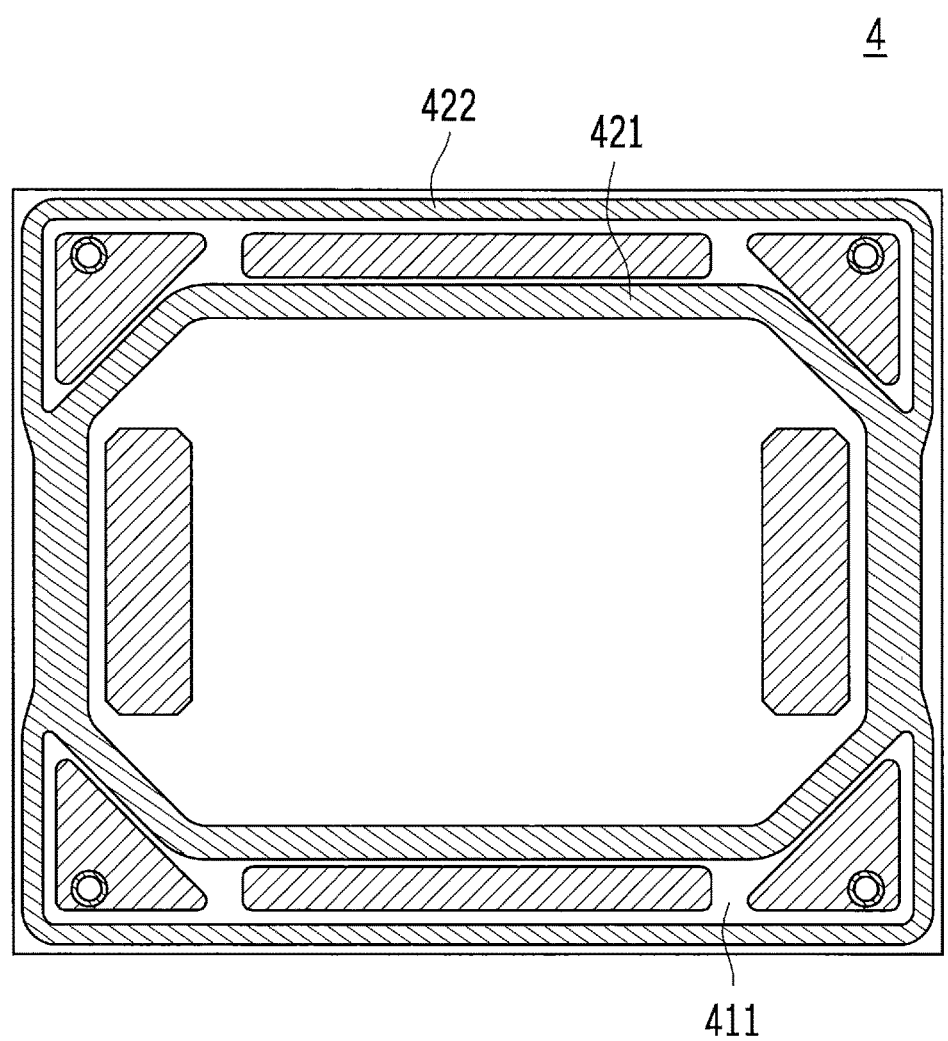
FIG. 23 is a schematic plan view illustrating the variation of the second sealing member of the crystal resonator according to the third embodiment.

However, the present invention is not limited hereto. The bonding materials 15a and 15b as the first annular parts may be formed so as to be partially overlapped, respectively, with the bonding materials 15c and 15d as the second annular parts. On the second main surface 312 of the first sealing member 3 and on the first main surface 211 of the crystal resonator plate 2 as shown in FIGS. 20 and 21, the sealing-member-side first bonding pattern 321 and the resonator-plate-side first bonding pattern 251, which become the bonding material 15a, are formed so as to be partially overlapped, respectively, with the sealing-member-side third bonding pattern 322 and the resonator-plate-side third bonding pattern 253. Similarly to the above, on the second main surface 212 of the crystal resonator plate 2 and on the first main surface 411 of the second sealing member 4 as shown in FIGS. 22 and 23, the resonator-plate-side second bonding pattern 252 and the sealing-member-side second bonding pattern 421, which become the bonding material 15b, are formed so as to be partially overlapped, respectively, with the resonator-plate-side fourth bonding pattern 254 and the sealing-member-side fourth bonding pattern 422. In this case, in the crystal resonator 101", the bonding materials 15a and 15b as the first annular parts are formed so as to be partially overlapped with, respectively, the bonding materials 15c and 15d as the second annular parts. In this way, by allowing the first annular parts and the second annular parts to be partially overlapped with each other, it is possible to minimize the increase in size of the crystal resonator 101" due to formation of the second annular parts, which contributes to reduction in size of the crystal resonator 101".

In the configuration indicated in FIGS. 20 to 23, the first annular part and the second annular part are overlapped with each other on the regions close to the respective short sides (i.e. the regions along the respective short sides) of the crystal resonator 101". However, the present invention is not limited thereto. The overlapped parts may be on the regions close to the respective long sides, or may be on both regions close to the respective short sides and close to the respective long sides.

The foregoing embodiment is to be considered in all respects as illustrative and not limiting. The scope of the invention is indicated by the appended claims rather than by the foregoing description, and all modifications and changes that come within the meaning and range of equivalency of the claims are intended to be embraced therein.

DESCRIPTION OF REFERENCE NUMERALS 101, 101', 101" Crystal resonator (piezoelectric resonator device)
102, 102', 102" Crystal oscillator (piezoelectric resonator device)
2 Crystal resonator plate (piezoelectric resonator plate)
3 First sealing member
4 Second sealing member
5 IC chip
12 Package
13 Internal space
15a, 15b Bonding material (first annular part)
15c, 15d Bonding material (second annular part)
16a-16d, 17a-17d Bonding material (conductive pattern)
111-125 First to fifteen through holes
22 Vibrating part
23 External frame part
24 Connecting part
221 First excitation electrode
222 Second excitation electrode
251 Resonator-plate-side first bonding pattern
252 Resonator-plate-side second bonding pattern
253 Resonator-plate-side third bonding pattern
254 Resonator-plate-side fourth bonding pattern
37, 37' Electrode pattern (base pattern)
321 Sealing-member-side first bonding pattern
322 Sealing-member-side third bonding pattern
421 Sealing-member-side second bonding pattern
422 Sealing-member-side fourth bonding pattern
433-436, 433'-436' First to fourth external electrode terminals (base pattern)
4331 Base layer
4332 Barrier layer
4333 Soldering layer
4334 Protective layer
51, 52 Plating film (electroless plating film)

The invention claimed is:

1. A piezoelectric resonator device, comprising:
a piezoelectric resonator plate including a first excitation electrode formed on a first main surface of a substrate, and a second excitation electrode formed on a second main surface of the substrate, the second excitation electrode making a pair with the first excitation electrode;
a first sealing member covering the first excitation electrode of the piezoelectric resonator plate;
a second sealing member covering the second excitation electrode of the piezoelectric resonator plate;
an internal space formed by bonding the first sealing member to the piezoelectric resonator plate and by bonding the second sealing member to the piezoelectric resonator plate, the internal space hermetically sealing a vibrating part including the first excitation electrode and the second excitation electrode of the piezoelectric resonator plate; and
a first electrode formed on an outer surface of the first sealing member and a second electrode formed on an outer surface of the second sealing member opposite to surfaces to be bonded to the piezoelectric resonator plate, wherein
the first electrode and the second electrode each comprise metal laminated films having a same film configuration and a same film thickness.

2. The piezoelectric resonator device according to claim 1,
wherein the first excitation electrode and the second excitation electrode are connected to the metal laminated films via through holes and no castellation is used to establish conduction between electrodes.

3. The piezoelectric resonator device according to claim 1,
wherein the metal laminated films comprise a four-layer structure constituted of a base layer, a barrier layer, a soldering layer and a protective layer, and wherein the layers other than the protective layer contain titanium (Ti).

4. The piezoelectric resonator device according to claim 1,
wherein the metal laminated films comprise an electroless plating film.

5. The piezoelectric resonator device according to claim 4,
wherein a sealing part to hermetically seal the vibrating part of the piezoelectric resonator plate is formed between the first sealing member and the piezoelectric resonator plate, and between the piezoelectric resonator plate and the second sealing member, so that the sealing part has an annular shape that surrounds the vibrating part in plan view, and
wherein the sealing part and a base pattern on which the electroless plating film is formed are each constituted of a Ti—Au layer.

6. The piezoelectric resonator device according to claim 1,
wherein an IC chip is mounted on the first sealing member,
wherein the metal laminated films formed on the first sealing member include a mounting terminal and wiring to mount the IC chip, and
wherein the metal laminated films formed on the second sealing member include an external electrode terminal to mount the piezoelectric resonator device on a circuit board.

7. The piezoelectric resonator device according to claim 1, wherein the first excitation electrode and the second excitation electrode are collectively formed on the first main surface of the substrate and the second main surface of the substrate respectively.

8. The piezoelectric resonator device according to claim 7, wherein the first excitation electrode and the second excitation electrode are collectively formed on the first main surface of the substrate and the second main surface of the substrate are collectively formed by a PVD method.

9. The piezoelectric resonator device according to claim 8, wherein the PVD method comprises one of: a film forming method for patterning in processing; a photolithograpy method; vacuum deposition; sputtering; ion plating; molecular beam epitaxy (MBE); and laser ablation.

* * * * *